US009798840B1

(12) United States Patent
Ginetti

(10) Patent No.: US 9,798,840 B1
(45) Date of Patent: Oct. 24, 2017

(54) METHODS, SYSTEMS, AND COMPUTER PROGRAM PRODUCT FOR IMPLEMENTING A SIMULATION PLATFORM WITH DYNAMIC DEVICE MODEL LIBRARIES FOR ELECTRONIC DESIGNS

(71) Applicant: Cadence Design Systems, Inc., San Jose, CA (US)

(72) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 15 days.

(21) Appl. No.: 14/884,730

(22) Filed: Oct. 15, 2015

(51) Int. Cl.
*G06F 17/50* (2006.01)
*G06F 17/30* (2006.01)

(52) U.S. Cl.
CPC .... *G06F 17/5009* (2013.01); *G06F 17/30327* (2013.01); *G06F 17/30345* (2013.01); *G06F 17/5081* (2013.01)

(58) Field of Classification Search
CPC .......... G06F 19/12; G06F 19/30; G06F 19/32; G06F 19/3437; G06F 17/5022; G06F 17/5068; G06F 17/5009; G06F 17/5045; G06F 2217/78
USPC .................................................. 716/132–136
See application file for complete search history.

(56) References Cited

U.S. PATENT DOCUMENTS

| | | |
|---|---|---|
| 6,378,116 B1 | 4/2002 | Ginneti |
| 6,405,345 B1 | 6/2002 | Ginneti |
| 6,519,743 B1 | 2/2003 | Nauts et al. |
| 6,622,290 B1 | 9/2003 | Ginetti et al. |
| 6,622,291 B1 | 9/2003 | Ginneti |
| 7,555,739 B1 | 6/2009 | Ginneti et al. |
| 7,634,743 B1 | 12/2009 | Ginneti |
| 7,949,987 B1 | 5/2011 | Ginneti et al. |
| 7,971,175 B2 | 6/2011 | Ginneti et al. |
| 7,971,178 B1 | 6/2011 | Marwah et al. |
| 8,046,730 B1 | 10/2011 | Ferguson et al. |
| 8,255,845 B2 | 8/2012 | Ginneti |
| 8,281,272 B1 | 10/2012 | Ginneti |
| 8,347,261 B2 | 1/2013 | Ginneti et al. |
| 8,364,656 B2 | 1/2013 | Arora et al. |
| 8,453,136 B1 | 5/2013 | Hahn et al. |
| 8,490,038 B1 | 7/2013 | Arora et al. |
| 8,527,934 B2 | 9/2013 | Ginneti et al. |
| 8,594,988 B1 | 11/2013 | Spyrou et al. |

(Continued)

*Primary Examiner* — Binh Tat
(74) *Attorney, Agent, or Firm* — Vista IP Law Group, LLP

(57) ABSTRACT

Various embodiments are to a simulation platform with dynamic device model libraries and the implementation therefor. The simulation platform includes one or more servers hosting thereupon a database management system, a simulation frontend, and a simulation backend. The simulation frontend includes or is operatively coupled to one or more electronic design databases managed by a database management system, stored in a persistent storage device, and including design data in one or more domains across one or more design fabrics. The simulation backend includes or is operatively coupled to one or more simulators that perform simulations, analyzes, and/or optimizations for an electronic design by obtaining simulation inputs that are appended to the one or more electronic design databases or are stored in one or more separate data structures that are co-managed by the database management system.

20 Claims, 21 Drawing Sheets

(56) References Cited

U.S. PATENT DOCUMENTS

| | | |
|---|---|---|
| 8,719,754 B1 | 5/2014 | Ginetti |
| 8,732,636 B2 | 5/2014 | Ginetti et al. |
| 8,762,906 B2 | 6/2014 | Ginetti et al. |
| 8,806,405 B2 | 8/2014 | Colwell et al. |
| 8,910,100 B1 | 12/2014 | Wilson et al. |
| 9,092,586 B1 | 7/2015 | Ginneti et al. |
| 9,129,081 B2 | 9/2015 | Ginneti et al. |
| 9,141,746 B1 | 9/2015 | Ginneti et al. |
| 9,208,137 B2 | 12/2015 | Ginetti |
| 9,223,915 B1 | 12/2015 | Ginneti et al. |
| 9,280,621 B1 | 3/2016 | Ginetti et al. |
| 9,348,960 B1 | 5/2016 | Ginetti et al. |
| 9,361,415 B1 | 6/2016 | Ginetti et al. |
| 2011/0035203 A1* | 2/2011 | Dalton .............. G06F 17/5009 703/14 |
| 2012/0023471 A1* | 1/2012 | Fischer ............. G06F 17/5068 716/115 |
| 2012/0324408 A1* | 12/2012 | Shacham ........... G06F 17/5045 716/102 |

* cited by examiner

|  | Without Monte Carlo Mismatch | With Monte Carlo Mismatch |
| --- | --- | --- |
| Without Parasitic Annotation | Folded, Detached | Unfolded, Embedded |
| With Parasitic Annotation | Unfolded, Embedded | Unfolded, Embedded |

FIG. 3D

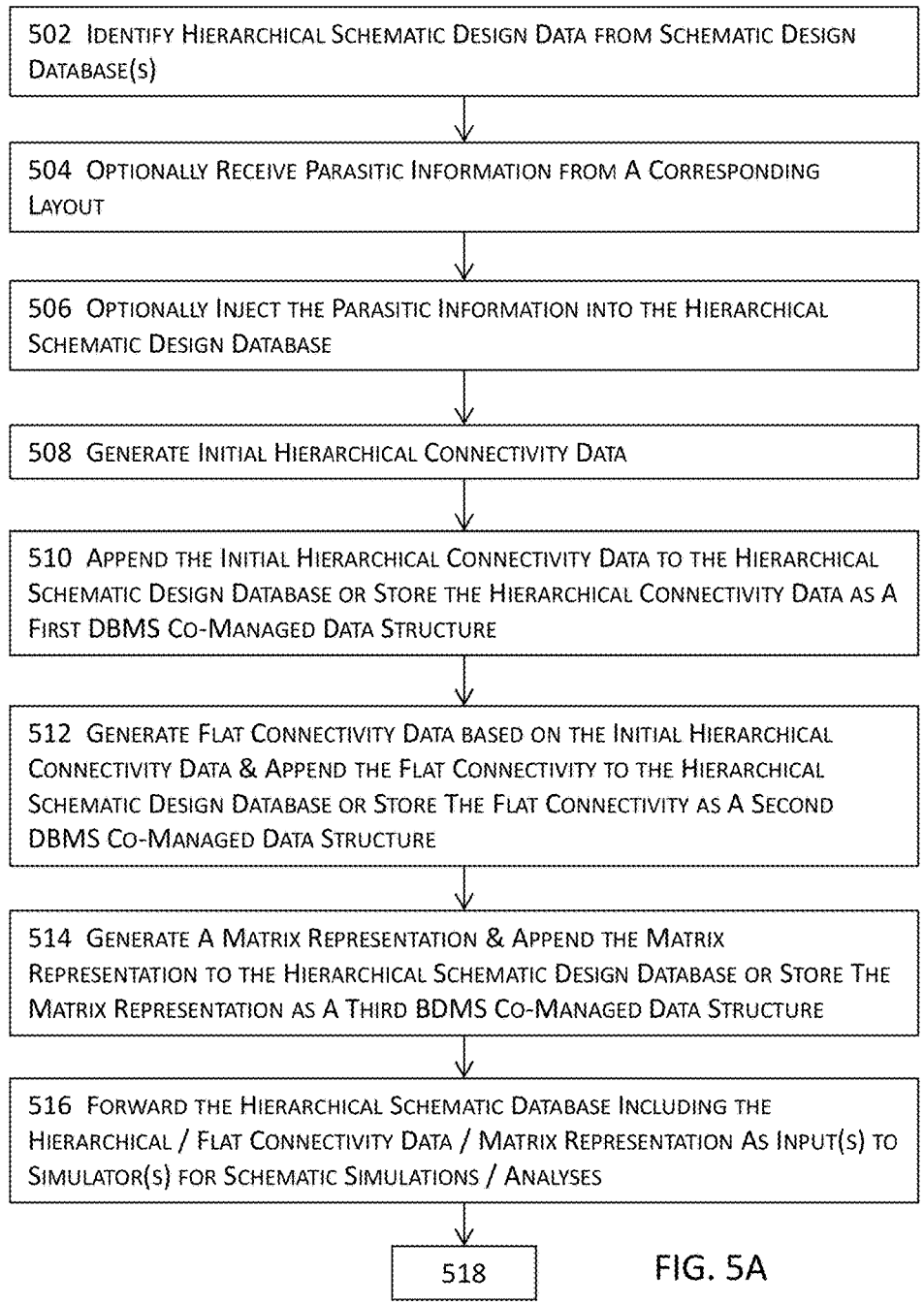

METHODS, SYSTEMS, AND COMPUTER PROGRAM PRODUCT FOR IMPLEMENTING A SIMULATION PLATFORM WITH DYNAMIC DEVICE MODEL LIBRARIES FOR ELECTRONIC DESIGNS

BACKGROUND

Conventional circuit simulators provide SPICE (Simulation Program with Integrated Circuit Emphasis) device models to perform various AC (alternating current), DC (direct current), RF (radio frequency), noise, and/or transient analyses for electronic designs, especially nonlinear electronic designs. These conventional circuit simulators accept a textual input such as a textual netlist in which connectivity among instances, nets, nodes, etc. of the electronic design of interest is specified using, for example, the ASCII (American Standard Code for Information Interchange) format (e.g., a Standard Parasitic Exchange Format or SPEF file) or textual format (e.g., a textual netlist).

Design data of modern electronic designs are often stored in a hierarchical data structure such as a schematic database and a layout database to facilitate the ease and efficiency of manipulating and processing design data, especially in view of the more complex electronic designs having more hierarchies. Moreover, modern EDA (electronic design automation) tools automatically instantiate parameterized models or cells where different parameter values corresponding to different variants of structures of a parameterized model have become more popular to simplify the design process. Parameterized models or cells are often coded in C++ language and compiled into object files. In conventional approaches, the structures of variants of a parameterized model are nevertheless directly specified in the textual input with their corresponding values. Due to high complexities and hence smaller margins for errors in modern electronic designs, parasitic information (e.g., resistance R, capacitance C, and/or inductance L) may affect the performance and/or reliability of an electronic design and is thus often included in various analyses to ensure that the electronic design, when manufactured, meets various performance and reliability goals.

In a conventional simulation flow such as the one illustrated in FIG. 1A, a netlister 104 receives and parses the layout database 102 to generate a textual netlist 106. For simulation purposes, the netlist is forwarded to the parser 108 through a frontend of a simulator. A simulation database is then formed with the information from the netlist 106 and subsequently used as an input 112 for the simulation engines. In other words, the original layout data in a database format is first translated or transformed into a textual netlist which is subsequently processed back into a database format—the simulation database. In addition to multiple transformations of design data among different formats, a textual netlist is well known to be difficult for partitioning (e.g., identifying the boundaries between an analog portion and a digital portion in a mixed-signal design). The difficulties in partitioning a textual netlist are further exacerbated in the parallel and distributed simulation paradigms and may affect load-balancing and the overall runtime of various computing nodes.

To accommodate the parasitics, a parasitic extractor 110 may extract the parasitic information from the layout database 102 to generate the required or desired parasitic information in a format such as an SPEF (Standard Parasitic Exchange Format), a DSPF (Detailed Standard Parasitic Format), or a DPF (Dynamic Process Format) parasitic file. The parasitic information in the parasitic file 114 needs to be stitched into the appropriate locations of the simulation database 112 using a parasitic stitcher 114 in the simulation platform. Such a stitching process is generally known to be error prone due to the requirement to identify the correct locations to insert or annotate the appropriate parasitic information or device. Once the stitching of parasitic information is done, the simulator 116 (e.g., a SPICE-like simulator) may then simulate the electronic design of interest with the simulation database 112.

With the textual input 112, the layout 102 and the simulator 116 are disconnected in the sense that any layout changes cannot be reflected in the analysis input without proceeding through various transformations from the layout database to the textual netlist and the textual parasitic files as well as the stitching processing, and that any findings from the simulation results cannot be effectively reflected in the layout database without proceeding through the reverse processes of the aforementioned transformations and stitching.

Therefore, there exists a need for methods, systems, and computer program products for implementing a simulation platform with dynamic device model libraries for electronic designs.

SUMMARY

Disclosed are method(s), system(s), and article(s) of manufacture for implementing a simulation platform with dynamic device model libraries for electronic designs in one or more embodiments. Some embodiments are directed at a method for implementing a simulation platform with dynamic device model libraries for electronic designs. In these embodiments, one or more schematic design databases stored in a non-transitory computer accessible storage medium and managed by a database management system for an electronic design may be identified; simulation inputs may be appended to the one or more schematic design databases or stored as one or more separate data structures that are co-managed by the database manage system that also manages the one or more schematic design databases; and one or more simulations, analyses, or optimizations at a schematic level may be performed with the simulation inputs in the database management system at one or more schematic simulation engines.

In some of these embodiments, hierarchical schematic design data may be identified from the one or more schematic design databases; and initial hierarchical connectivity data may be generated for the hierarchical schematic design data. In addition or in the alternative, parasitic information may be extracted from one or more corresponding physical design databases for the electronic design in one or more design fabrics; and the parasitic information may be injected into the one or more hierarchical schematic design databases.

In some of these embodiments, the initial hierarchical connectivity data may be appended to the one or more schematic design databases or stored the initial hierarchical connectivity data as one or more first database management system co-managed data structures that are co-managed by the database management system. In addition, flat connectivity data may be generated based in part or in whole upon the initial hierarchical connectivity; and the flat connectivity data may be appended to the one or more schematic design databases or stored the flat connectivity data as one or more second database management system co-managed data structures that are co-managed by the database management system.

In some of these immediately preceding embodiments, a matrix representation may be generated for the electronic design; and the matrix representation may be appended to the one or more schematic design databases or stored the matrix representation as one or more third database management system co-managed data structures that are co-managed by the database management system. At least a portion of the one or more hierarchical schematic design databases including the initial hierarchical connectivity data, the flat connectivity data, and the matrix representation may be forwarded as the simulation inputs to the one or more simulation engines for performance of the one or more simulations, analyses, or optimizations.

In some embodiments, one or more changes to one or more schematic designs may be identified; the one or more changes may be captured at least by updating the one or more schematic design databases or one or more instances thereof; the initial hierarchical connectivity data that are appended to the one or more schematic design databases or stored in the one or more data structures may be updated into updated hierarchical connectivity data without parsing the electronic design or a portion thereof; and flat connectivity data that are appended to the one or more schematic design databases or stored in the one or more data structures may be updated into updated flat connectivity data without parsing the electronic design or the portion thereof.

In some of these embodiments, at least a portion of the parasitic information affected by the one or more changes may be identified; and the at least the portion of the parasitic information that is appended to the one or more schematic design databases or stored in the one or more data structures may be updated into updated parasitic information without stitching or annotating the updated parasitic information. In addition, the one or more hierarchical schematic databases including the updated hierarchical connectivity data, the updated flat connectivity data, and an updated matrix representation may be forwarded as the simulation inputs to the one or more schematic simulation engines for performance of the one or more simulations, analyses, or optimizations.

In some embodiments, one or more variability or mismatching analyses may be performed by injecting deltas into the electronic design and analyzing the electronic design with the deltas using a Monte Carlo engine. Some embodiments are directed at a method for implementing a simulation platform with and dynamic device model libraries for electronic designs. In these embodiments, initial parasitic information and initial hierarchical connectivity data may be determined from one or more layout databases, wherein the one or more layout databases are stored in a non-transitory computer accessible storage medium for an electronic design; the initial parasitic information and initial hierarchical connectivity data may be stored in the one or more layout databases or in one or more separate data structures co-managed by a database management system that also manages the one or more layout databases; and the one or more layout databases or one or more corresponding portions thereof may be forwarded to a plurality of layout simulators that perform one or more layout simulations, analyses, or optimizations.

In some of these embodiments, one or more hierarchical extracted views for the one or more layout databases may be generated, wherein a hierarchical extracted views of the one or more hierarchical extracted views includes at least two hierarchical levels instead of a flat structure; the initial parasitic information may be combined with the one or more hierarchical extracted views; and the one or more hierarchical extracted views may be stored in the one or more layout databases or in one or more first data structures co-managed by the database management system. In addition or in the alternative, the electronic design or the one or more layout databases may be parsed to extract the initial parasitic information; the electronic design or the one or more layout databases may also be parsed to determine the initial hierarchical connectivity data; and the initial parasitic information may then be combined with the initial connectivity data.

Further, the one or more layout simulations, analyses, and/or optimizations may be performed by directing the plurality of layout simulators to access the one or more layout databases for inputs in some of these embodiments. At least one change to at least one layout database of the one or more layout databases may be identified in some embodiments, wherein the at least one change is caused by a source including at least one of a modification to a layout of the electronic design, a modification to a schematic design of the electronic design, results of one or more schematic level simulations, analyses, or optimizations, or results of one or more layout simulations, analyses, or optimizations.

In some of these immediately embodiments, at least a part of the initial parasitic information that is affected by the at least one change may be identified; and the at least a part of the initial parasitic information may be updated into updated parasitic information based in part or in whole upon the at least one change without parsing or stitching. Moreover, at least a part of the initial hierarchical connectivity data that is affected by the at least one change may be identified; and the at least a part of the initial hierarchical connectivity data may then be updated into one or more updated hierarchical connectivity data based in part or in whole upon the at least one change without parsing or extraction.

In addition, at least a part of the one or more hierarchical extracted views that is affected by the at least one change may be identified; and the at least a part of the one or more hierarchical extracted views may then be updated into one or more updated hierarchical extracted views based in part or in whole upon the at least one change without parsing or extraction in some of these embodiments. The one or more additional layout simulations, analyses, and/or optimizations may then be performed in light of the at least one change by directing the plurality of layout simulators to access the updated parasitic information, the one or more updated hierarchical connectivity data, and/or the one or more updated hierarchical extracted views, without re-performing parsing, extraction, stitching, or annotation.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at a simulation platform with dynamic device model libraries. In these embodiments, the simulation platform includes one or more servers hosting thereupon a database management system; a simulation frontend including or operatively coupled to one or more electronic design databases managed by the database management system, stored in a persistent storage device, and including design data in one or more domains across one or more design fabrics; and a simulation backend including or operatively coupled to one or more simulators that perform simulations, analyses, and/or optimizations for an electronic design by receiving simulation inputs appended to the one or more electronic design databases or stored in one or more separate data structures that are co-managed by the database management system.

In some of these embodiments, the simulation frontend may further include hierarchical connectivity data and flat connectivity data appended to the one or more electronic design databases or stored in the one or more separate data structures that are co-managed by the database management system; and a matrix representation for the electronic design appended to the one or more electronic design databases or stored in the one or more separate data structures that are co-managed by the database management system.

In addition or in the alternative, the simulation frontend may also comprise a simulation database generator that generates a matrix representation as an input for the one or more simulators for storage in one or more in-memory instances of the one or more electronic design databases in the simulation backend. In addition or in the alternative, the simulation frontend may include the simulation database generator that generates an in-memory copy of flat connectivity data as the input for the one or more simulators for storage in the one or more in-memory instances of the one or more electronic design databases in the simulation backend.

A parsing module and an extraction module may also be included in the simulation frontend, wherein the parsing module parses the electronic design to generate an initial hierarchical connectivity data and is at least partially stored in memory; and the extraction module extracts parasitic information from at least one of the one or more electronic design databases (e.g., a layout database of an electronic design). In some embodiments, the simulation platform performs one or more re-simulations without using the parsing module or the extraction module.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 3D illustrates some examples of implementation choices for devices that may be used in a simulation platform described herein in some embodiments.

FIGS. 5A-5B jointly illustrate a more detailed block diagram for implementing a simulation platform with dynamic device model libraries in one or more embodiments.

DETAILED DESCRIPTION

Figure 1A:
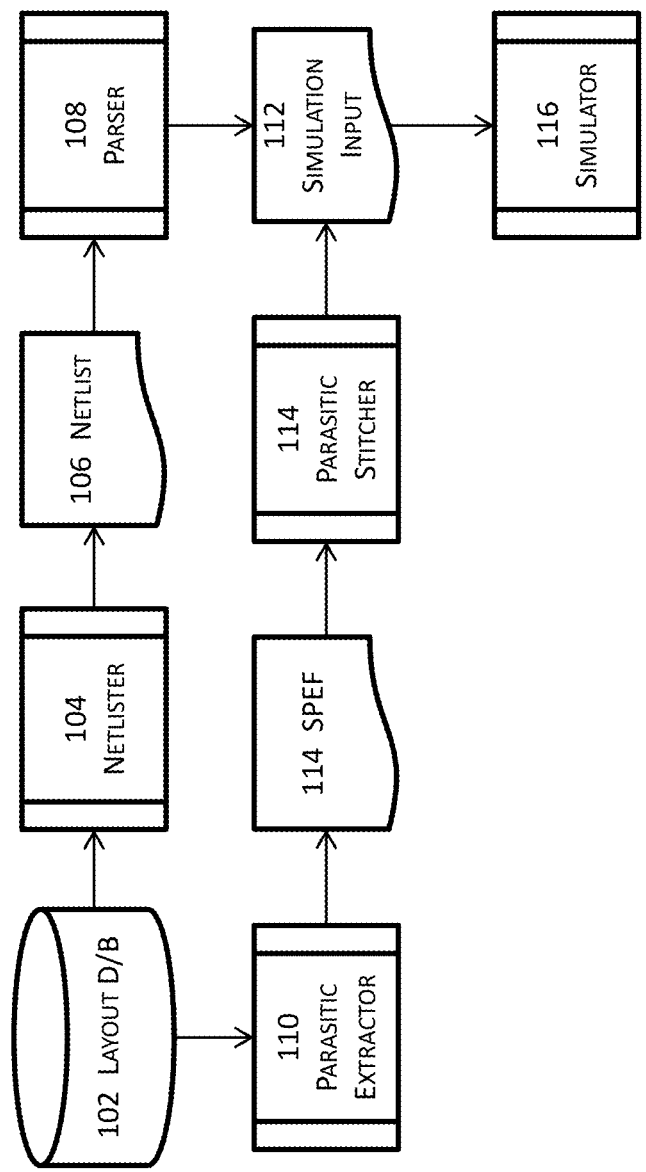
FIG. 1A illustrates a high level block diagram of a system for implementing a simulation platform.

Various embodiments of the invention are directed to methods, systems, and articles of manufacture for implementing, verifying or checking, and analyzing an electronic design. In some embodiments, an electronic design may include a multi-fabric electronic design including design components across multiple design fabrics although the techniques described herein apply with equal and full effects to general electronic designs in a single design fabric (e.g., an integrated circuit or IC design fabric, an IC package design fabric, a printed circuit board or PCB design fabric, or a test bench design fabric, etc.) Other objects, features, and advantages of the invention are described in the detailed description, figures, and claims.

Some embodiments described herein are directed to a simulator frontend that includes or function in conjunction with a parser (e.g., a parsing module), a database, and a database generator. The parser receives and parses an input to populate the database; and the database generator forwards the simulation database to a simulator backend that performs various simulations. The database can be either transiently maintained in memory as conventional approaches or persistently stored on disk. The database stores therein both hierarchical and flat information (e.g., hierarchical as well as flat connectivity of an electronic design).

The database may append various modifications, annotations, and/or properties to the design database (e.g., the layout database) in some embodiments or may store these modifications, annotations, and/or properties as co-managed files or data structures (e.g., database tables) in some other embodiments. In these embodiments, the EDA suite including at least the layout suite and the simulation platform maintains a single database by either appending the modifications, annotations, and/or properties needed for the simulation platform to the layout database or by storing these modifications, annotations, and/or properties as one or more separate files.

A data structure or file that is co-managed by a database management system that also manages one or more design databases includes a data structure that may be accessed by using the same database language (e.g., data definition language, data manipulation language, query language, etc.) and may be subject to the same DBMS configurations and/or storage engine management. A DBMS co-managed data structure may also support the same constraint enforcement and share the same application programming interfaces in some embodiments. With a single database serving at least the layout suite and the simulation platform, the memory footprint required by the simulation platform is greatly reduced when compared to conventional simulators.

The simulator backend of the simulator platform may include a compiled model interface that allows the integration of new and/or proprietary devices into the simulator platform using a flexible high-level programming language interface (e.g., a C- or C++ language interface that is disposed between the simulator frontend and the simulation engine of the simulator backend. During the simulation of an electronic design, this compiled model interface may include a flat netlist of the electronic design in some embodiments.

In some other embodiments, this compiled model interface may directly function in conjunction with the database in the simulator frontend when the database includes both the hierarchical and the flat connectivity of the electronic design. In these embodiments, the design database itself includes both the hierarchical connectivity and flat connectivity, and the flat connectivity may be directly leveraged in the compiled model interface of the simulator backend. As a result, the need for storing another copy of connectivity of an electronic design in the simulator backend as required in some conventional approaches is eliminated, and the memory footprint of the simulator platform is thus reduced. In these embodiments, the compiled model interface in the simulator backend acts as a lightweight overlay on top of the flat connectivity stored in the design database.

The simulator backend may further include a matrix representation of an electronic design of interest. The simulator backend receives the electronic design from the database in the frontend via, for example, the simulator database generator to populate the matrix representation which is then used for the simulator engine in the simulator backend to perform various simulations by using various solvers to solve the equations derived for the matrix representation for the electronic design of interest.

The simulator platform including the simulator frontend and the simulator backend may also update design databases either incrementally with smaller sets of changes in one or more batches or altogether by committing all changes at once (e.g., all changes made to the layout database by an atomic transaction). With the capability of incrementally updating the design databases, the simulator platform may seamlessly function in conjunction with electrically aware design (EAD) implementation platform. More details about various aspects descried above will be described below with reference to FIGS. 1B-3D.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1B:
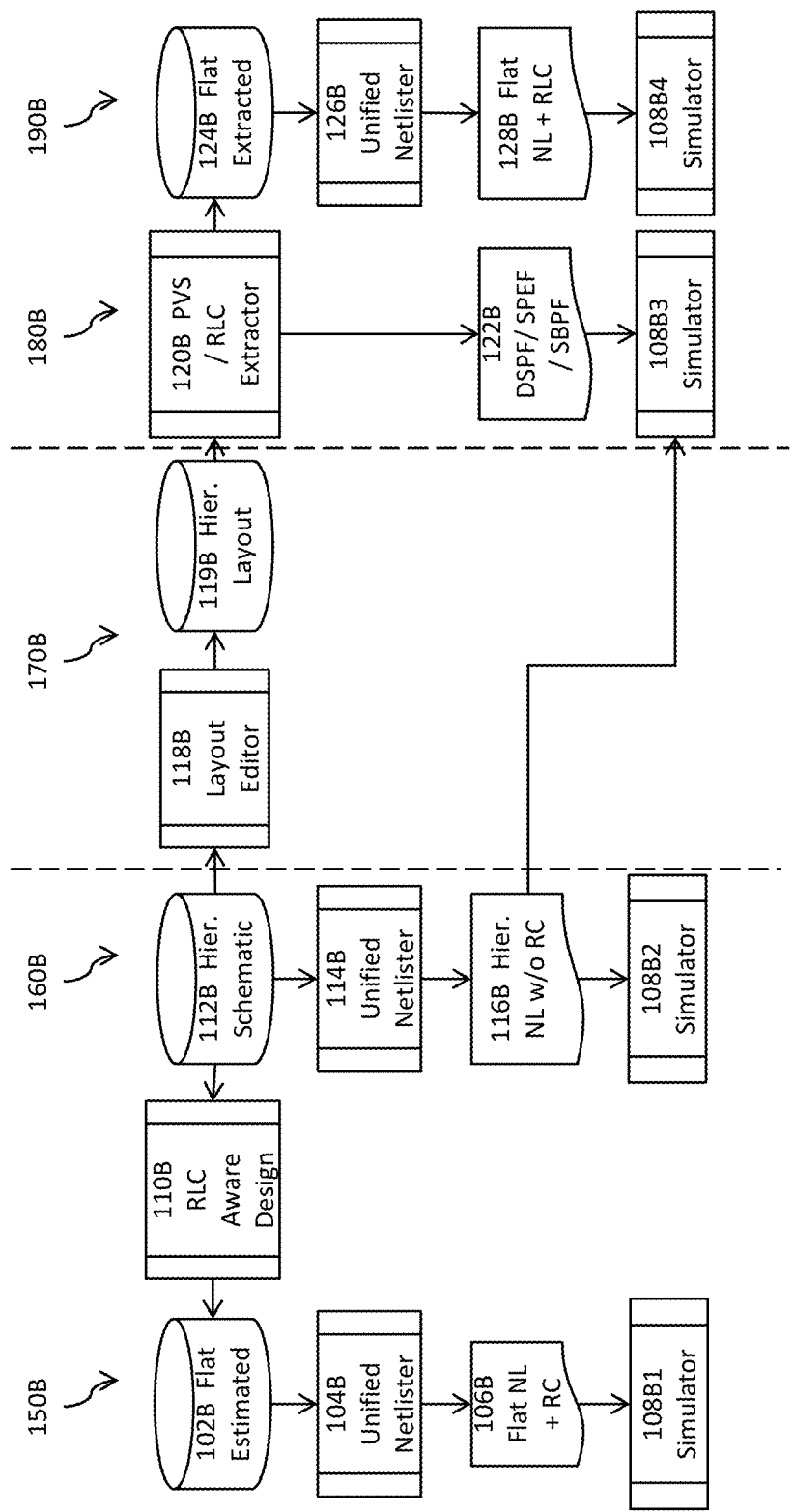
FIG. 1B illustrates a high level block diagram of a simulation platform with dynamic device model libraries in one or more embodiments.
Figure 1C:
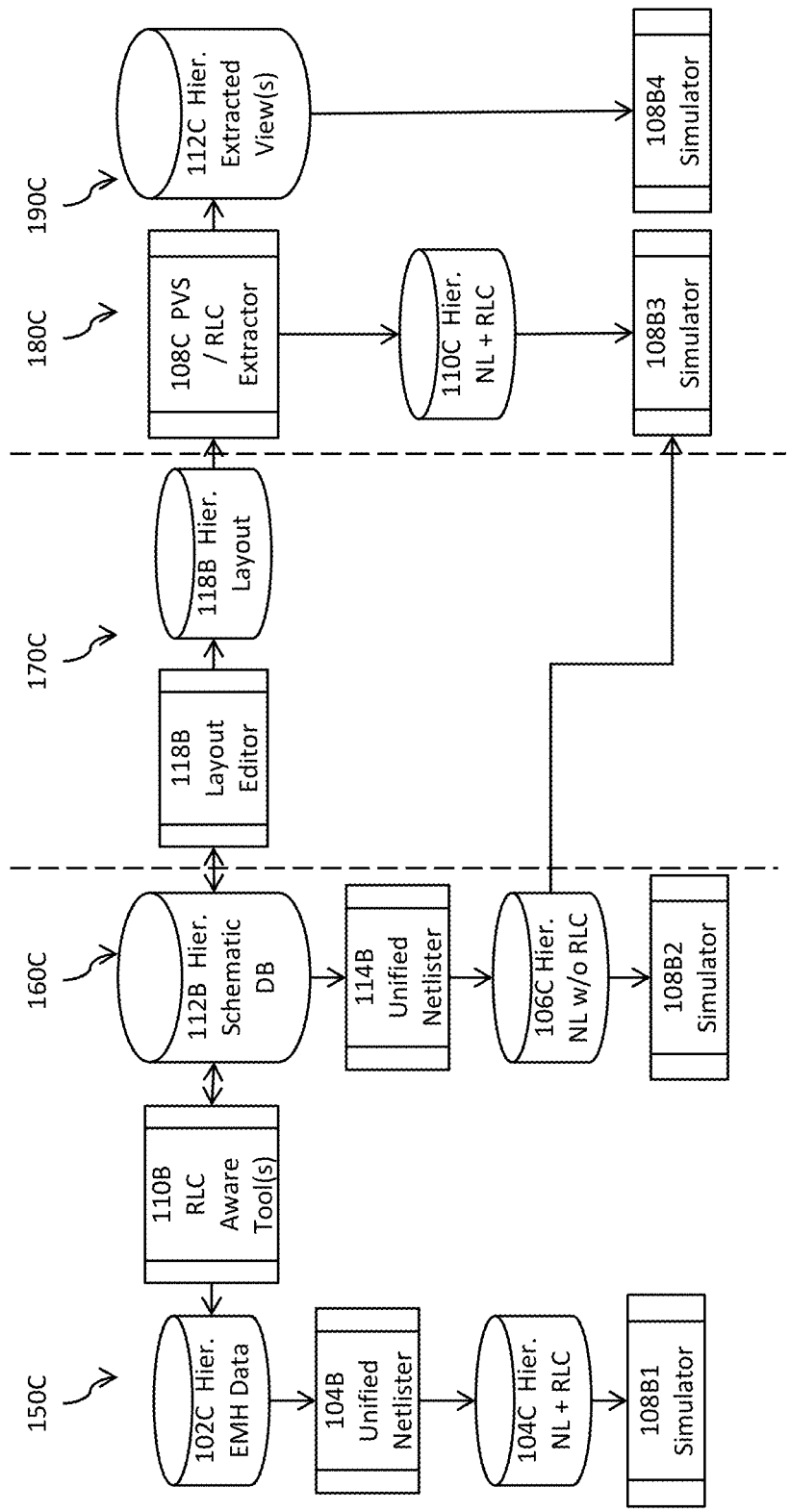
FIG. 1C illustrates another high level block diagram of a simulation platform with dynamic device model libraries in one or more embodiments.
Figure 1D:
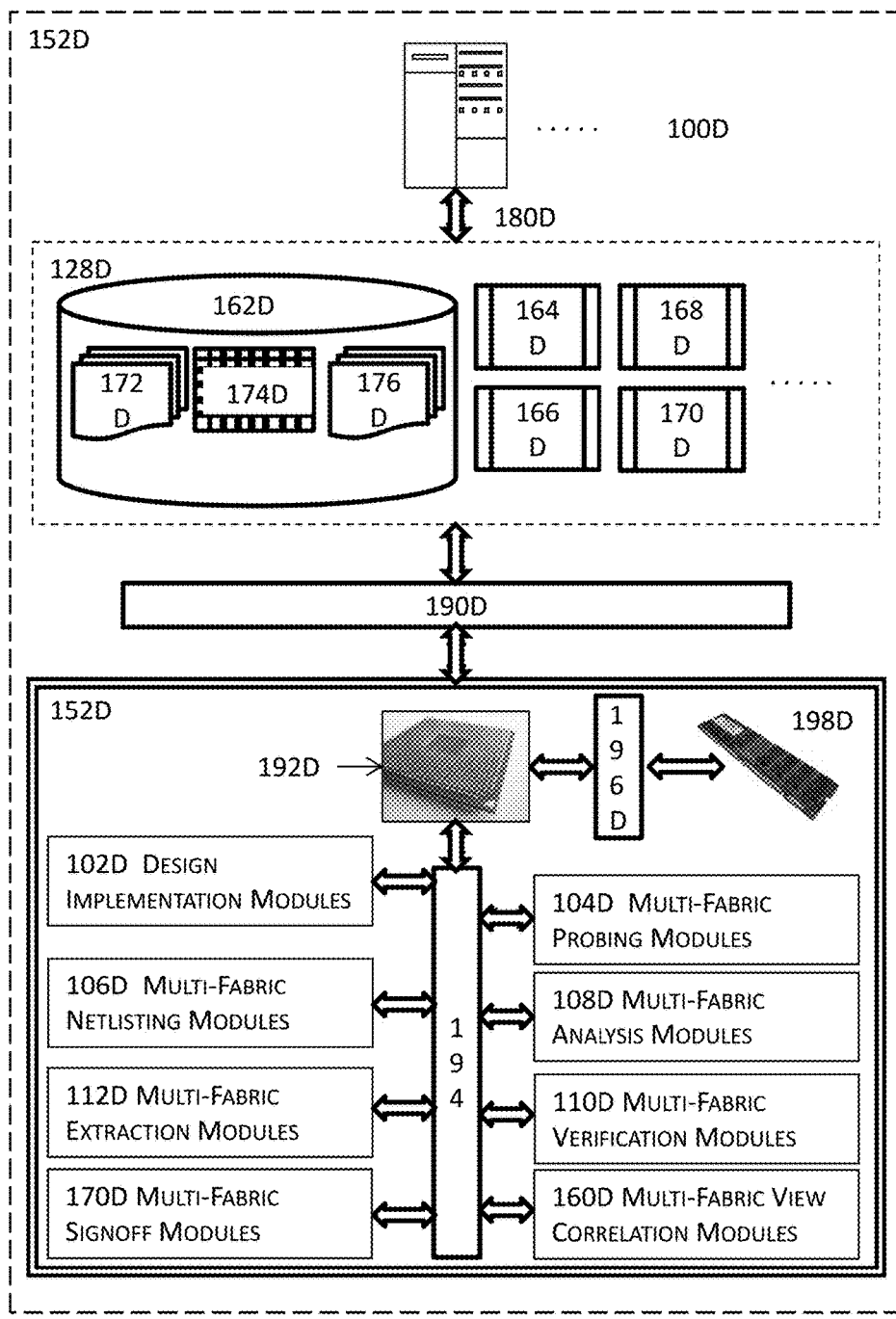
FIG. 1D illustrates a more detailed block diagram of a simulation platform including a simulation frontend and a simulation backend in one or more embodiments.

FIG. 1D illustrates a high level block diagram of a system for implementing a simulation platform with dynamic device model libraries in one or more embodiments. In these one or more embodiments, FIG. 1D illustrates an illustrative high level schematic block diagrams for implementing a multi-fabric mixed-signal electronic design spanning across multiple design fabrics with electrical and/or thermal analysis awareness and may comprise one or more computing systems 100D, such as one or more general purpose computers described in the System Architecture Overview section to implement one or more special proposes. It shall be noted that techniques described herein apply with full and equal effects to electronic designs in a single design fabric as well as electronic designs across multiple design fabrics. Therefore, various modules described herein with reference to FIG. 1D may include modules that operate in a single design fabric as well as modules operating across multiple design fabrics. For example, a multi-fabric netlisting module 106D may include a netlisting module operating in a single design fabric and/or a multi-fabric netlisting module operating across multiple design fabrics. Similarly, a multi-fabric extraction module 112D may include an extraction module operating in a single design fabric and/or a multi-fabric extraction module operating across multiple design fabrics; a multi-fabric signoff module 170D may include a signoff module operating in a single design fabric and/or a multi-fabric signoff module operating across multiple design fabrics; a multi-fabric probing module 104D may include a probing module operating in a single design fabric and/or a multi-fabric probing module operating across multiple design fabrics; a multi-fabric analysis module 108D may include an analysis module operating in a single design fabric and/or a multi-fabric analysis module operating across multiple design fabrics; a multi-fabric verification mechanism or module 110D may include a verification module operating in a single design fabric and/or a multi-fabric verification module operating across multiple design fabrics; and a multi-fabric view correlation mechanism or module 160D may include a view module operating in a single design fabric and/or a multi-fabric view module operating across multiple design fabrics;

In some embodiments, the one or more computing systems 100D may invoke various system resources such as the processor(s) or processor core(s), memory, disks, etc. The one or more computing systems 100D may also initiate or interact with other computing systems to access, via a computer bus architecture (e.g., a system bus, a control bus, a data bus, or any combinations thereof), various resources 128D that may comprise a floorplanner, a global routing engine, and/or a detail routing engine 164D, a layout editor 166D, a design rule checker 168D, a verification engine 170D, etc.

The one or more computing systems 100D may further write to and read from a local or remote non-transitory computer accessible storage 162D that stores thereupon data or information such as, but not limited to, one or more databases (174D) such as one or more schematic design databases or physical design databases and one or more electronic circuit design specification databases in one or several design fabrics, various statistics, various data, rule decks, various design rules, constraints, etc. (172D), or other information or data (176D) that may be used to facilitate the performance of various functions to achieve the intended purposes.

A database described herein may include a relational database which comprises a digital database whose organization is based on one or more relational model of data such that the data stored therein are organized into one or more tables or relations of rows and columns with a unique key for each row in some embodiments. A database management system (DBMS) includes a computer system (e.g., a server) running a software application that interacts with users, other applications, and the database to capture and analyze data and may further allow querying, update, administration, definition, creation, or modification of databases. A database management system includes data application programming interfaces (APIs) and reference database supporting the data API for integrated circuit (IC) designs, IC package designs, PCB designs, testbench designs, etc.

In some embodiments, the one or more computing systems 100D may include or, either directly or indirectly through the various resources 128D, invoke a set of modules 152D including hardware modules and software modules or combinations of one or more hardware modules and one or more software modules that are stored at least partially in computer memory may comprises one or more design implementation modules 102D to implement electronic designs at various abstraction levels (e.g., schematic level, layout level, etc.) The set of modules 152D may further include one or more multi-fabric probing modules 104D to probe multi-fabric designs across multiple design fabrics.

The set of modules 152D may further optionally include one or more multi-fabric netlisting modules 106D (e.g., a netlister) to netlist multi-fabric designs across multiple design fabrics. In addition or in the alternative, the set of modules 152D may further include one or more multi-fabric analysis modules 108D to perform various static and transient electrical and/or thermal analyses or simulations as well as other analysis or simulation related tasks across multiple design fabrics. In some embodiments, the set of modules 152D may further include one or more track multi-fabric checking or verification modules 110D to check or verify the correctness of multi-fabric designs across multiple design fabrics. In addition or in the alternative, the set of modules 152D may comprise one or more multi-fabric extraction modules 160D to extract various types of data or information from electronic designs in various design fabrics.

A symbolic view of a block of circuit elements may include a symbol or a place holder for the block and may or may not have the correct dimensions to represent the actual area occupied by the block of circuit elements. A symbolic view of a block of circuit elements may also include some interface information such as the types of ports, terminals, pins, or pads (collectively ports hereinafter) interfacing with external circuit elements, the number of each type of ports, or the identification of each port in some embodiments. In some of these embodiments, a symbolic view of a block of circuit elements may further include the correct dimensions or location of at least one port interfacing with external circuitry.

In these aforementioned embodiments, a symbolic view of a block of circuit elements includes some design data of the block at its boundary (e.g., data or information about the interface to external circuit components) yet does not include detailed design data for circuit components inside the boundary of the block. In some embodiments, a symbolic view of a block of circuit component designs and the corresponding one or more schematic views and/or one or more corresponding layout views of the block at one or more granularities or hierarchical levels may be stored in one or more data structures such that various processes, systems, modules, or even the designers may access any such schematic or layout at the desired granularity or hierarchical level automatically, manually, interactively, or on demand.

In some embodiments, a symbolic view may be stored or linked together with a schematic view or layout view of a circuit component, block, or cell by using, for example, a profile. The profile may further include or be associated with other information or data including, for example, parasitic information (e.g., capacitances, resistances, etc.), electrical information (e.g., currents, voltages, inductances, etc.), physical information (e.g., sizes or profiles of various shapes, etc.), timing or delay information of the electronic design of interest, other performance-related information, analysis results (e.g., EMI or electromagnetic interference analyses, ISI or inter-symbol interference analyses, crosstalk analyses, etc.), simulation results in various domains and/or fabrics, or any combinations thereof in some of these embodiments. The multi-fabric view correlation module 160D may also correlate the aforementioned information or data with the multi-fabric electronic design, a portion thereof, or the corresponding designs of circuit component in the multi-fabric electronic design. In some embodiments, the multi-fabric view correlation module 160D may further annotate the pertinent portions or circuit component designs with some or all of the aforementioned information or data.

The set of modules 152D may further include one or more multi-fabric signoff modules 170D to perform various signoff and design closure tasks. For example, the one or more multi-fabric signoff modules 170D may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level or better accuracy to ensure an electronic design meets or exceeds power, performance, and/or area goals in some embodiments.

The one or more multi-fabric signoff modules 170D may include one or more physical verification modules to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, The one or more multi-fabric signoff modules 170D may include one or more one or more computational lithography modules to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 100D may include the various resources 128D such that these various resources may be invoked from within the computing system via a computer bus 180 (e.g., a data bus interfacing a microprocessor 192D and the non-transitory computer accessible storage medium 198D or a system bus 190D between a microprocessor 192D and one or more engines in the various resources 128D). In some other embodiments, some or all of these various resources may be located remotely from the computing system 100D such that the computing system may access the some or all of these resources via a computer bus 180D and one or more network components.

The computing system may also include one or more modules in the set of modules 152D. One or more modules in the set 152D may include or at least function in tandem with a microprocessor 192D via a computer bus 194D in some embodiments. In these embodiments, a single microprocessor 192D may be included in and thus shared among more than one module even when the computing system 100D includes only one microprocessor 192D. A microprocessor 192D may further access some non-transitory memory 198 (e.g., random access memory or RAM) via a system bus 196D to read and/or write data during the microprocessor's execution of processes.

Referring to FIG. 1B which illustrates a high level block diagram of various simulation regimes, simulations are usually performed in two categories—pre-layout regime and post-layout regime. The pre-layout regime may include the estimated flow 150B and the schematic flow 160B. In the estimated flow 150B, estimated design data from a flat estimated design data store 102B may be transmitted to a netlister 104B to generate a flat netlist 106B, which may be further stitched or annotated with parasitic information from a parasitic aware design tool 110B. The parasitic aware design tool 110B brings in parasitic information and variability (e.g., variability due to the variations in the manufacturing processes) at early stages of the electronic design process flow and definitely before a layout is generated or completed.

The flat netlist with parasitic information 106B is in a textual format (a textual netlist stitched with a textual parasitic file) may then be forwarded to one or more simulators 108B1 for simulation. During the schematic flow 160B, the design data from a hierarchical schematic database 112B may forwarded to a netlister 114B (which may be the same as or different from the netlister 104B) to generate a hierarchical netlist 116B. This hierarchical netlist 116B generated from the hierarchical schematic database does not include, however, parasitic information. The hierarchical netlist 116B in a textual format may then be forwarded to a simulator 108B2 for schematic simulations. More details about the inputs to simulators will be described in subsequent paragraphs.

The layout editor 118B may receive the schematic design data from the hierarchical schematic database 112B and produce a layout 119B (e.g., a hierarchical layout) which may be transmitted to the post-layout regime including a stitching flow 180B and an extraction flow 190B. For example, the layout 119B may be transmitted to a physical verification tool or a parasitic extraction tool 120B to extract the parasitic information 122B from the database. The parasitic information 122B may be stored in various common formats such as DSPF (detailed standard parasitic format), SPEF (standard parasitic exchange format), SPF (standard parasitic format), any compressed and/or binary formats for storing parasitic information, RSPF (reduced standard parasitic format), etc. in some embodiments.

The parasitic information 122B may include geometric information (e.g., coordinates, lengths, widths, etc.) and or electrical characteristics derived from geometric information (e.g., resistances, capacitances, etc.) The parasitic information 122B may be combined (e.g., via stitching) with the hierarchical netlist 116B and forwarded to a simulator 108B4 for simulations. The post-layout regime may further include the extraction flow 190B during which a flat extracted database 124B may be derived from the physical verification or parasitic extraction tool 120B. The design data from the flat extracted database 124B may be forwarded to a netlister 126B to generate a flat netlist with parasitic information 128B. This flat netlist with parasitics 128B may be forwarded to a simulator 108B4 for simulations.

One of the disadvantages of these approaches is the use of textual netlist that needs to be parsed before running the simulation. Another disadvantage of these approaches is the separation of the device connectivity and parasitic information that will force the simulator frontend to stitch the parasitics back to the device connectivity.

Another disadvantage of these approaches illustrated in FIG. 1B is the use of a flat netlist (e.g., 128B and 106B) which is known to cause difficulties in partitioning an electronic design (e.g., identifying the boundaries between an analog portion and a digital portion of an electronic design). Another disadvantage of this approach is that the parasitic information is often represented as devices (e.g., resistors, capacitors, etc.) that are difficult to discern from circuit devices and render the stitching process more difficult, especially when textual netlists (e.g., 106B, 116B, 122B, and 128B) are involved. These disadvantages are improved upon and eliminated in another approach illustrated in FIG. 1C.

FIG. 1C illustrates an improved high level block diagram of various simulation regimes. These simulation regimes also include the pre-layout regime and the post-layout regime. The pre-layout regime includes the estimated flow 150C and the schematic flow 160C. During the estimated flow 150C, a hierarchical estimated design data module 102C (e.g., hierarchical embedded module hierarchy or EMH design data) may function in conjunction with the parasitic aware design tool 110B, which injects parasitic information or data into an electronic design of interest (or a portion thereof), and the hierarchical schematic design database 112B to forward estimated design data to a netlister 104B which extracts or produces a hierarchical netlist with parasitic information 104C which may be stored in the database (described later).

The hierarchical netlist with parasitic information 104C may then be forwarded to a simulator 108B1 for simulations. During the schematic flow 160C, design data from the hierarchical schematic database 112B may be forwarded to a netlister 114B which produces a hierarchical netlist 106C. In some embodiments where parasitic information is not injected into or annotated in the schematic design, the hierarchical netlist 106C is generated without parasitic information. The hierarchical netlist 106C may also be stored in the database (e.g., the schematic database) by appending the netlist data to the existing database or by storing the netlist data in one or more separate files. The hierarchical netlist may also be forwarded to a simulator 108B2 for simulations. Rather than producing textual netlist files (e.g., 106B and 116B), these approaches now produce the connectivity in a database format (e.g., 104C and 106C) to eliminate the disadvantages presented in the approaches illustrated in FIG. 1B.

The stitching flow 180C invokes the physical verification tool or parasitic extraction tool 108C to generate a hierarchical connectivity (e.g., a netlist) with parasitic information 110C in a database format instead of one or more textual files. This hierarchical connectivity with parasitic information may be appended to the layout database (e.g., an Open Access database) in some embodiments or may be managed as one or more separate files by the database management system (DBMS) in some other embodiments. The extraction flow is further simplified into an extracted view flow 190C where one or more hierarchical extracted views 112C may be obtained from the hierarchical layout 118B and stored in a database format as the hierarchical connectivity 110C. Parasitic information may also be passed in the hierarchical extracted views or data from the physical verification and/or parasitic extraction tool 108C. The hierarchical extracted views or data 112C, instead of flat extracted views or data, may be forwarded directly into a simulator 108B4 without going through a netlister to produce a flat textual netlist as those approaches illustrated in FIG. 1B.

Figure 2A:
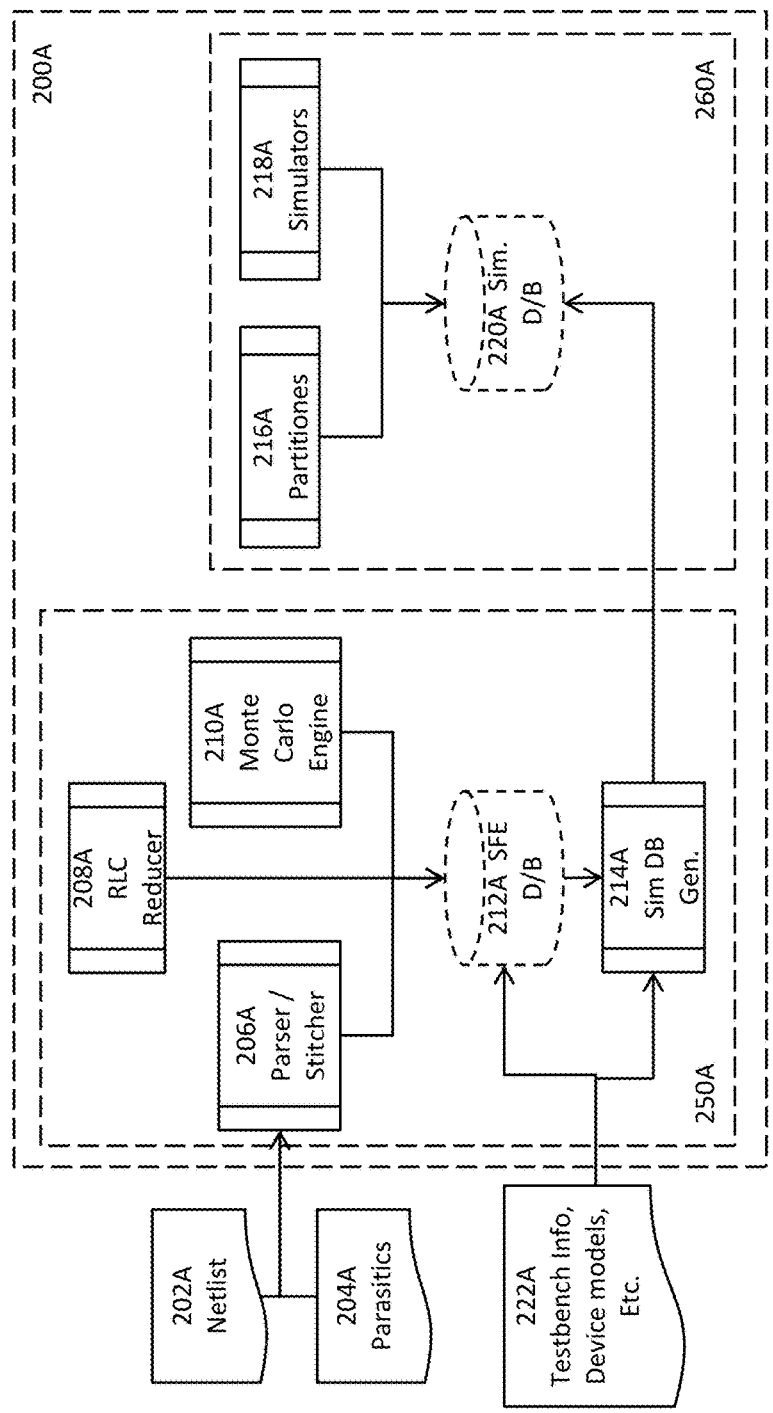
FIG. 2A illustrates a high level block diagram of a simulation platform including a simulation frontend and a simulation backend in one or more embodiments.

FIG. 2A illustrates more details about a simulation platform 200A including the simulation frontend 250A and the simulation backend 260A. In FIG. 2A, a textual netlist 202A and parasitic information 204A may be passed into a parser and stitcher 206A in the simulation frontend 250A. The parser and stitcher 206A parse the textual netlist 202A to arrange the design into a simulation frontend database 212A. The parser and stitcher 206A may further examine the parasitic information 204A, which may also be in a textual file, and determines which part of the netlist 202A is going to be annotated or stitched with appropriate parasitic information from 204A. For example, an extractor may operate on a design layout to extract parasitic information and generate a parasitic file outside a simulator in some embodiments. The simulator in these embodiments may parse the netlist, the parasitic file, and stitches the parasitic information included in the parasitic file into the parsed netlist.

In some embodiments, the parser and stitcher 206A reads a textual file (e.g., a textual netlist, a textual parasitic file, etc.) and lexically, syntactically, and/or semantically analyze the textual file. The parser and stitcher 206A then creates some data structures that may be accessed through, for example, one or more application programming interfaces (APIs). In conventional approaches, these tasks are required every time a simulation is run. For example, if a testbench is simulated in a parallel or distributed environment having multiple computing nodes, these tasks are performed on each of these multiple computing nodes. When the testbench or some data thereof (e.g., some design data, parasitic information, etc.) are modified to merit another simulation run, these tasks need to be performed again on each of these multiple computing nodes.

With the techniques described herein on the other hand, these tasks (e.g., the reading or parsing of one or more textual files, the lexical, syntactical, and/or semantic analyses of the one or more text files, etc.) will be performed only once to create the simulation frontend database and/or the simulation database, either of which may be modified at any time and thus be accessed by, for example, the simulators for any number of currently running or subsequent simulations. In some embodiments where the simulation frontend database is created as one or more binary files to represent the netlist (e.g., the netlist is appended to the design database in some embodiments or saved as one or more separate database files co-managed by the same database management system (DMS) managing various design databases in other embodiments), these tasks performed by the parser and stitcher 206A are no longer necessary. Appending a netlist to a database or storing the netlist as a DMS co-managed database file is in sharp contrast with conventional approaches where a netlist is usually represented in a flat, textual format (e.g., a text file) that is provided as an input to a simulator.

In some embodiments, the parser and stitcher 206A may also parse a textual file (e.g., a textual netlist, a textual parasitic file, etc.) and annotate created data structures or information (e.g., the parasitic data structures or information, testbench data structures or information, device model data structures or information, or any combinations thereof, etc.) These annotation or stitching tasks are similarly repeated with conventional approaches every time a simulation is performed. With the techniques described herein, these annotation or stitching tasks need to be performed only once into the simulation frontend database in one or more binary files that may be accessed as many times as required or desired, without performing these annotation or stitching tasks again. In some embodiments where the simulation frontend platform 250A directly dumps the simulation frontend database 212A (and/or the simulation database 220A), these annotation or stitching tasks are no longer needed and thus may not be performed at all.

Because parasitic information is often represented as devices (e.g., resistors, capacitors, etc.), stitching parasitic information into a textual file such as the netlist 202A may be difficult, tedious, and error prone. The simulation frontend database 212A may further interact with a parasitic reducer 208A which removes some parasitic elements (e.g., small parasitic elements) from the parasitic network or the design stitched with parasitic information so as to reduce the number or amount of parasitic elements to be processed in order to conserve computation resources with no or very little compromise on capturing the parasitic effects in the electronic design of interest. The simulation frontend database 212A may further interact with a Monte Carlo engine 210A to perform mismatch analyses and inject small variability or deltas into the design so that the devices in an electronic design are not entirely identical in the analyses or simulation of electronic design with multiple coupled degrees of freedom to determine, for example, the probabilistic interpretation of one or more characteristics of the electronic design.

The parser and stitcher 206A may thus transform a textual netlist 202A into a transient database 212A (e.g., the simulation frontend database) which may further receive testbench information, device models, etc. from 222A to create another transient database—the simulation database 220A—by using the simulation database generator 214A. The simulation database 214A may interact with a partitioners 216A to identify the boundaries between, for example, analog portions and digital portions of an electronic design or other types of actual boundaries (e.g., boundaries of cells, macros, blocks, etc. of an electronic design) or artificial boundaries (e.g., boundaries artificially created for load balancing, parallel computing, distributed computing, etc.) in the electronic design. The partitioned electronic design may be forwarded to one or more simulators 218A in a parallel or a distributed computing paradigm for performing various analyses on the electronic design of interest.

Figure 2B:
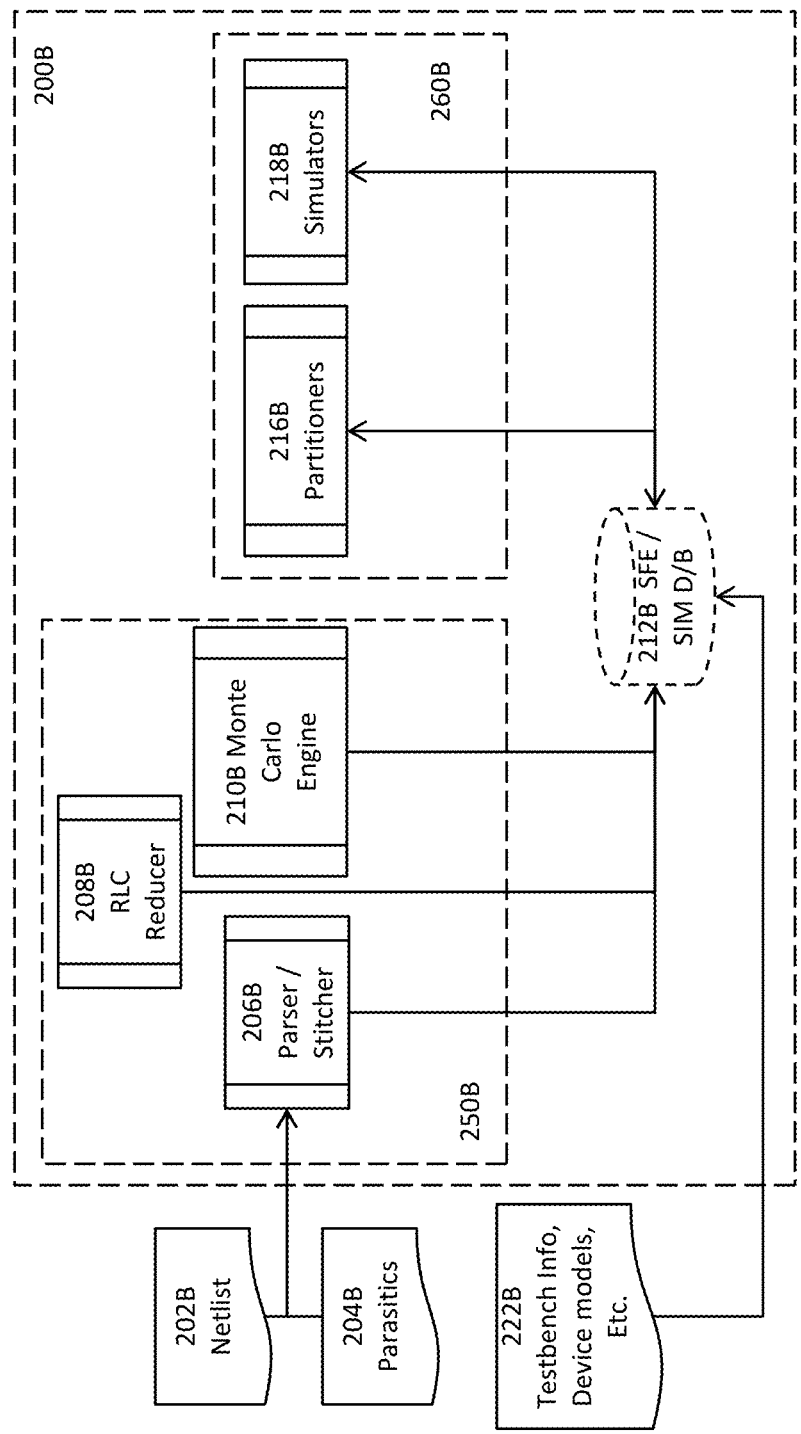
FIG. 2B illustrates another high level block diagram of a simulation platform including a simulation frontend and a simulation backend in one or more embodiments.

FIG. 2B illustrates more details about another simulation platform 200B including the simulation frontend (SFE) 250B and the simulation backend (SBE) 260B. This simulation platform illustrated in FIG. 2B differs from that illustrated in FIG. 2A in that a single database 212B may be used as both the simulation frontend database and the simulation database, rather than or instead of having separate simulation frontend database (e.g., 212A) and the simulation database (e.g., 220A in FIG. 2A). In addition, the parser/stitcher 206B, the RLC reducer 208B, and/or the Monte Carlo engine 210B may directly transmit their respective data or information to this single database 212B without having a simulation database generator (e.g., 214A in FIG. 2A) in some embodiments. It shall be noted that the direct transmission of data or information to the single database 212B does not preclude the choice of indirect transmission of data or information to the single database via one or more other modules in some other embodiments. In these embodiments, the testbench information, device models, etc. (222B) may also be directly transmitted to the single database 212B. This single database may remain transient as the simulation frontend database 212A and/or the simulation database 220A in FIG. 2A.

This single database 212B may interact with the partitioners 216B to identify, for example, the boundaries between analog portions and digital portions of an electronic design or any other boundaries (e.g., boundaries of cells, macros, blocks, or portions, etc.) in the electronic design. The partitioned electronic design may be forwarded to one or more simulators 218B in a parallel or a distributed computing paradigm for performing various analyses or simulations on the electronic design of interest. The other components such as the parser/stitcher 206B, the RLC (resistance, inductance, capacitance) reducer 208B, the Monte Carlo engine 210B may respectively perform identical or substantially functions as the corresponding components in FIG. 2A such as the parser/stitcher 206A, the RLC reducer 208A, the Monte Carlo engine 210A.

Figure 2C:
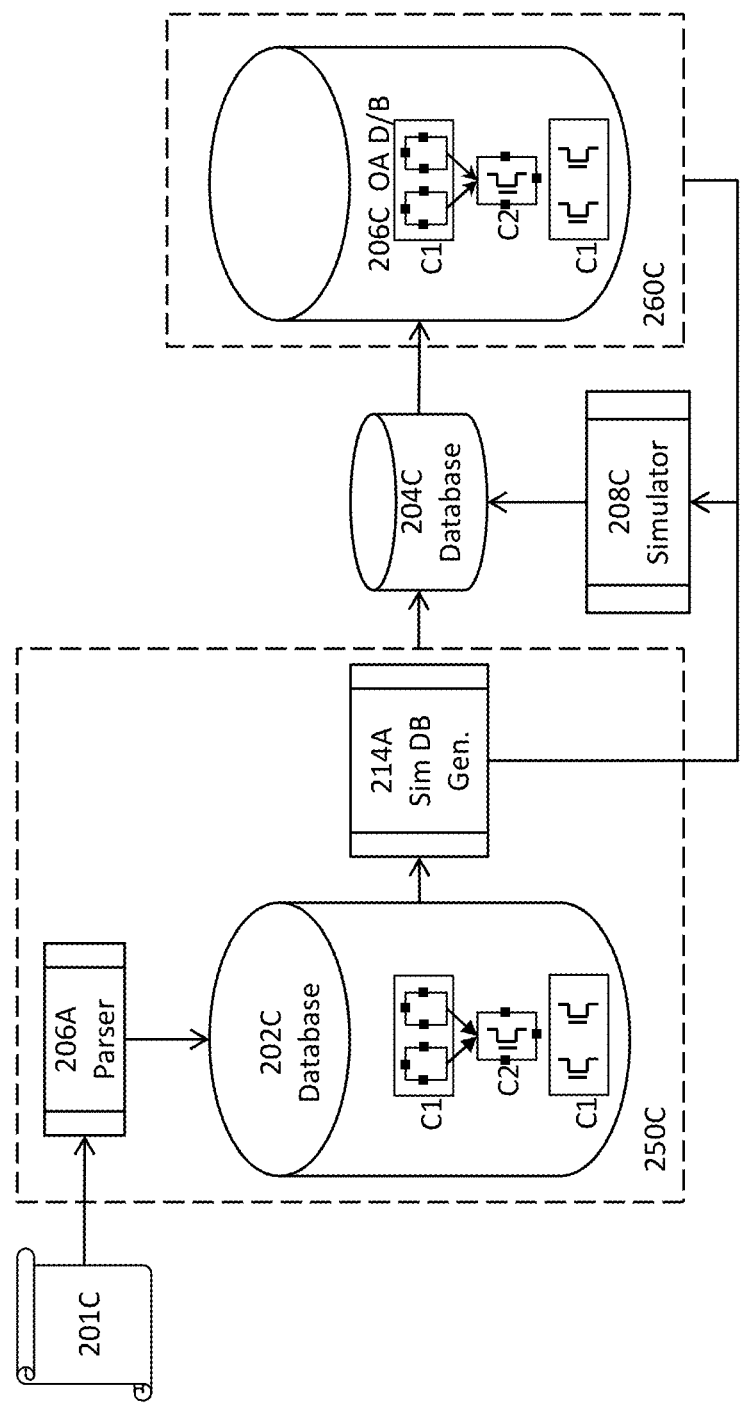
FIG. 2C illustrates another high level block diagram of a simulation platform including a simulation frontend in one or more embodiments.

FIG. 2C illustrates an improved simulation platform including the simulation frontend 250C in some embodiments. In these embodiments, the simulation frontend 250C includes a parser 206A which parses the input 201C to populate a persistent database 202C. The single persistent database 202C includes not only the design data (e.g., devices, cells, instances, etc.) but also connectivity in a hierarchical format as well flat connectivity for an electronic design of interest. In the physical domains across multiple design fabrics, the single persistent database 202C may also include parasitic information or data associated with the hierarchical connectivity and/or the flat connectivity in some embodiments.

In the schematic domains across multiple design fabrics, the single persistent database 202C may include parasitic information or data associated with the hierarchical connectivity and/or the flat connectivity, depending upon whether or not the schematic databases in these multiple design fabrics are already contain the parasitic information or data, although a schematic database having no parasitic information or data may be easily augmented with such parasitic information or data with appropriate parasitic aware design tools in these multiple design fabrics using the multi-fabric design environment. In some embodiments where a separate simulation database is to be generated for one or more simulators, the design data in the persistent database 202C may be forwarded to the simulation database generator 214A to populate and generate the simulation database for one or more simulators 208C.

The simulation frontend 250C may also commit the modifications, properties, data, and/or annotations needed for the simulation database to the design data database (e.g., the layout database). In some embodiments, the design database may be used as both the simulation frontend database and the simulation database by appending the modifications, properties, data, and/or annotations to the design database in some embodiments or by managing the modifications, properties, data, and/or annotations (e.g., parasitic annotations, occurrence-based annotations, etc.) as one or more separate files or objects by the database management system in some other embodiments. In these embodiments, the persistent database 202C is in fact the persistent database 204C.

Once the parser 206A completes its functions to populate the persistent database 202C (e.g., the initial population and generation of the persistent database 202C), the persistent database (202C or 204C) thus includes the data and information needed for the simulation engines. During subsequent simulation runs (e.g., 260C), one or more simulators may receive the requisite data or information directly from the persistent database 206C (which may be the same database as 204C in some embodiments or may be a separate, persistent database as 202C in some other embodiments) to update, for example, the matrix representation of the electronic design, the flat connectivity overlay, etc. for subsequent simulation runs with a much shorter runtime due to the elimination of parsing the input, stitching parasitics, and populating the database.

Any transient or persistent changes in design database of the electronic design may be reflected in the matrix representation of the electronic design due to the use of the design database with appended connectivity and parasitics in the same design database or associated connectivity and parasitics in separate database files or tables, regardless of whether or not a separate simulation database is used in addition to the simulation frontend database. That is, the database 204C, the simulation frontend database 202C, and the simulation database 206C may be the same single database in some embodiments or may be multiple instances of the same, single database in some other embodiments.

This is especially advantageous in distributed or parallel simulation of an electronic design where parsing the inputs and populating the database needs to be performed only once to generate the persistent database that may be referenced by all the computing nodes so these computing nodes need not individually, separately parse the inputs and populate some transient databases as some conventional approaches are required to perform. In some embodiments, the simulation frontend 250C may further receive testbench information, PCB information, IC package information, device models, etc. across multiple design fabrics, and perform data binding of leaf devices. The simulation frontend 250C may also evaluate a parameter against multiple candidate parameter values for electronic designs including one or more parameterized cells or blocks. The simulation frontend 250C may also perform optimizations, compaction, and/or removal of dangling devices, instances, or cells in some embodiments.

Figure 2D:
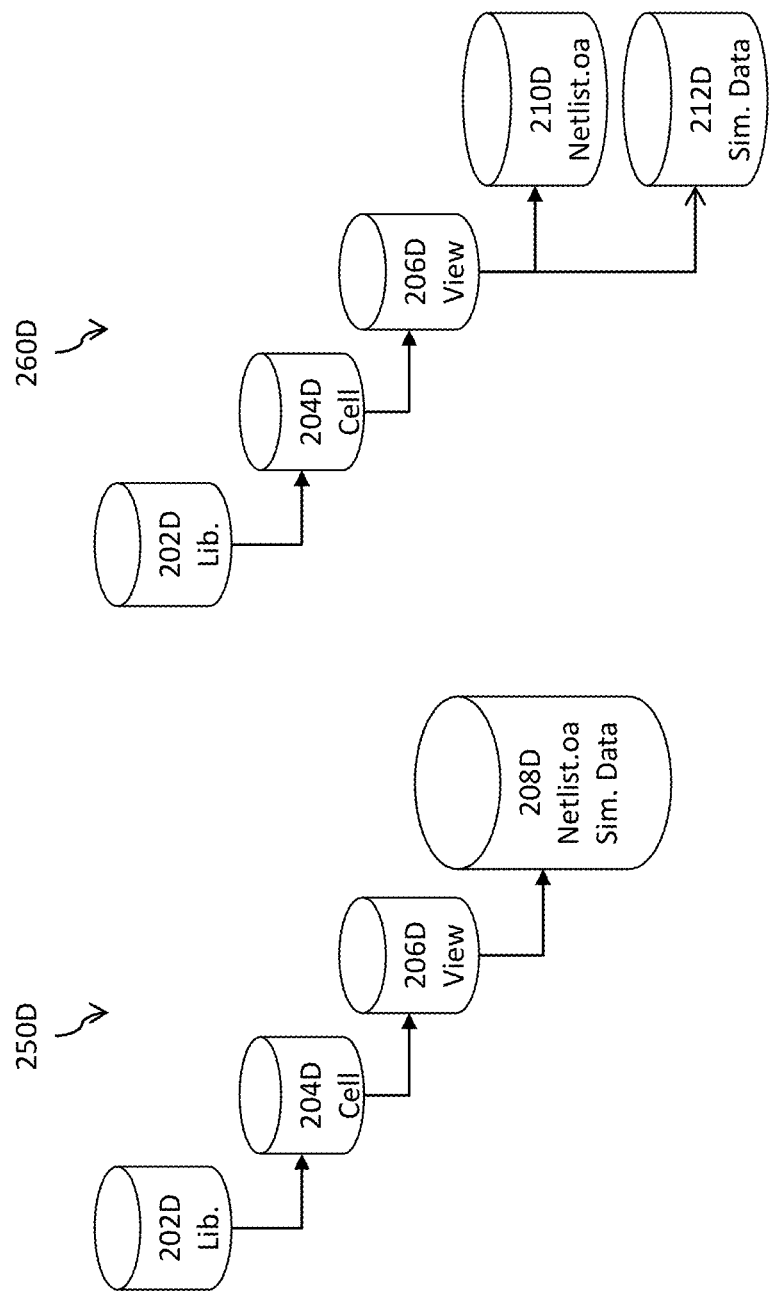
FIG. 2D illustrates an example of how data are managed in a database system for a simulation platform with dynamic device model libraries in some embodiments.

FIG. 2D illustrates how a persistent database (e.g., 202C, 204C, and/or 206C) may manage the data for the simulation platform including the simulation frontend and the simulation backend in some embodiments. In some of these embodiments, the simulation frontend 250C may persistently append the modifications, properties, data, and/or annotations to the design database (e.g., the layout database 204C) as illustrated in 250D. In these embodiments, the design database may include the design data of libraries 202D, cells 204D, views 206D, and the simulation data appended to the netlists 208D.

In some other embodiments, the simulation frontend 250C may leverage the database management system (DBMS) of the design database(s) (e.g., the layout database 204C) in the multi-fabric design environment to store the modifications, properties, data, and/or annotations as one or more separate files that are managed by the same database management system of the design database(s) as illustrated in 260D. In these embodiments, the design database may include the design data of libraries 202D, cells 204D, views 206D, the netlists 210D.

The simulation data is stored as a co-managed file 212D in the same design database. In some other embodiments, a hybrid approach may be used to persistently or transiently append some modifications, properties, data, and/or annotations to the design database in the multi-fabric design environment and may store some other modifications, properties, data, and/or annotations as one or more separate database files or tables that are in the database format as the design database and are co-managed by the same database management system. For example, one or more sets of modifications, properties, data, and/or annotations may be stored as one or more separate database files or tables, while one or more other sets of modifications, properties, data, and/or annotations may be persistently appended to the design database(s) in the multi-fabric design environment. This may be advantageous in analyses such as corner analyses or what-if analyses where the modifications, properties, data, and/or annotations may not necessarily be desirable and hence committed.

Figure 2E:
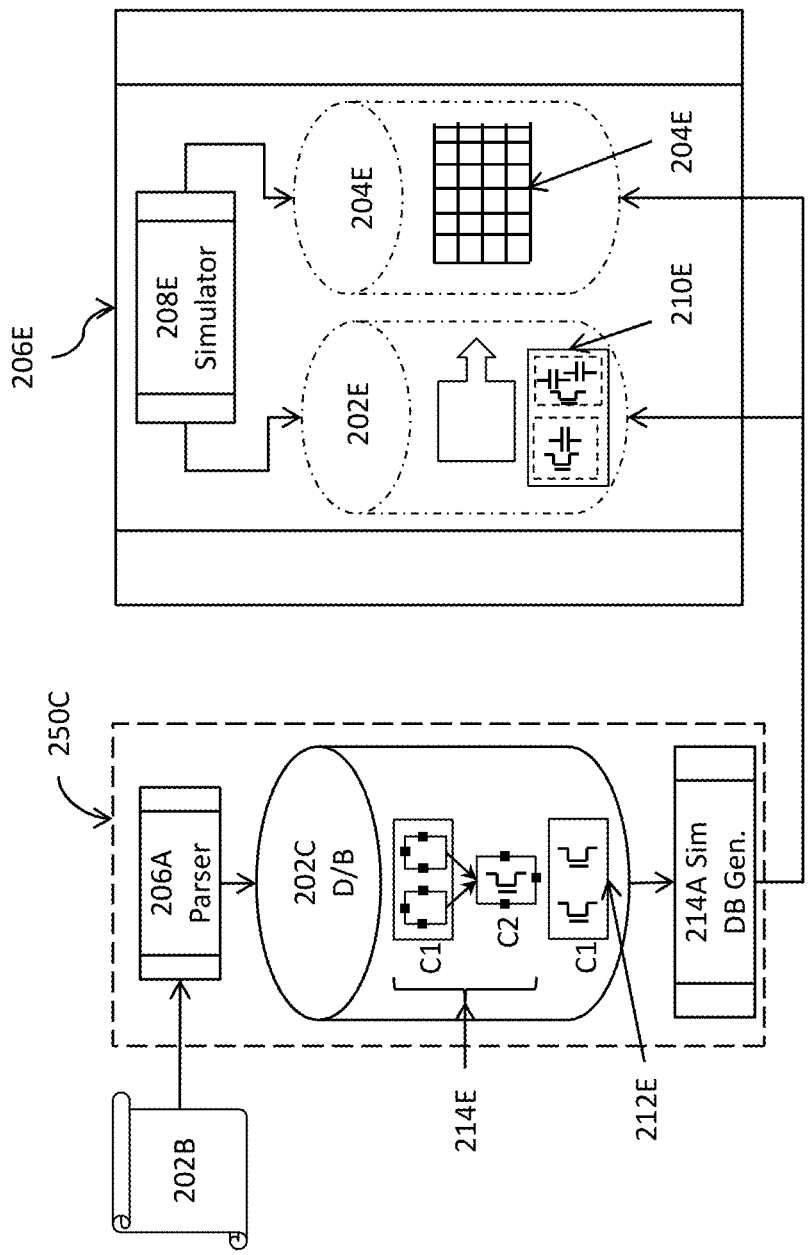
FIG. 2E illustrates another more detailed block diagram of a simulation platform including a simulation frontend and a simulation backend in one or more embodiments.

FIG. 2E illustrates more details about a simulation platform including the simulation frontend 250C and the simulation backend 206E in some embodiments. During the initial population of the database (e.g., the design database, the simulation frontend database, and/or the simulation database across multiple design fabrics), the simulation frontend 250C receives input 202B, and the parser 206A parses the input to populate the persistent database 202C which also includes flat connectivity 212E in addition to the hierarchical connectivity 214E. The simulation database generator 214A, which may be optional in some embodiments, may interact with a compiled model interface 202E in the simulation backend 206E. The compiled model interface 202E allows the integration or installation of new or proprietary devices into the simulation platform using a high-level programming language interface (e.g., the C-language or C++ language, etc.) For example, the compiled model interface 202E uses the libraries, methods, objects, classes, etc. of a high-level programming language to allow for the integration and addition of a new standard device design and/or a third-party developed, proprietary device into the simulation platform.

The compiled model interface 202E may include a flat netlist 210E that is referenced by the simulation engine 208E for analyzing the electronic design of interest in some embodiments. It shall be noted the persistent database 202C may also include flat connectivity 212E in some embodiments. In some embodiments, a transient copy of the flat connectivity 210E may be eliminated from the simulation backend 206E, and the flat connectivity 212E in the persistent database 202C may be leveraged instead when various tools in the multi-fabric design environment need to reference the flat connectivity.

The simulation backend 206E may include a matrix representation 204E of the electronic design of interest which is also formed with the aid from the simulation database generator 214A in the simulation frontend 250C in some embodiments. That is, some techniques may initially use the simulation database generator 214A or another module to obtain design information from the persistent database 202C or an instance thereof to populate the matrix representation 204E of an electronic design of interest.

The matrix representation 204E may be appended to the persistent database 202C (in the embodiments where the persistent database 202C is also used as the simulation database) or may be saved as a separate database file or table that is co-managed by the database management system that also manages the persistent database 202C. The matrix representation 204E may then be associated with or linked to the design database or an instance thereof such that a change in one (e.g., the persistent database 202C) is automatically reflected in the other (e.g., the matrix representation 204E) in some of these embodiments.

Figure 2F:
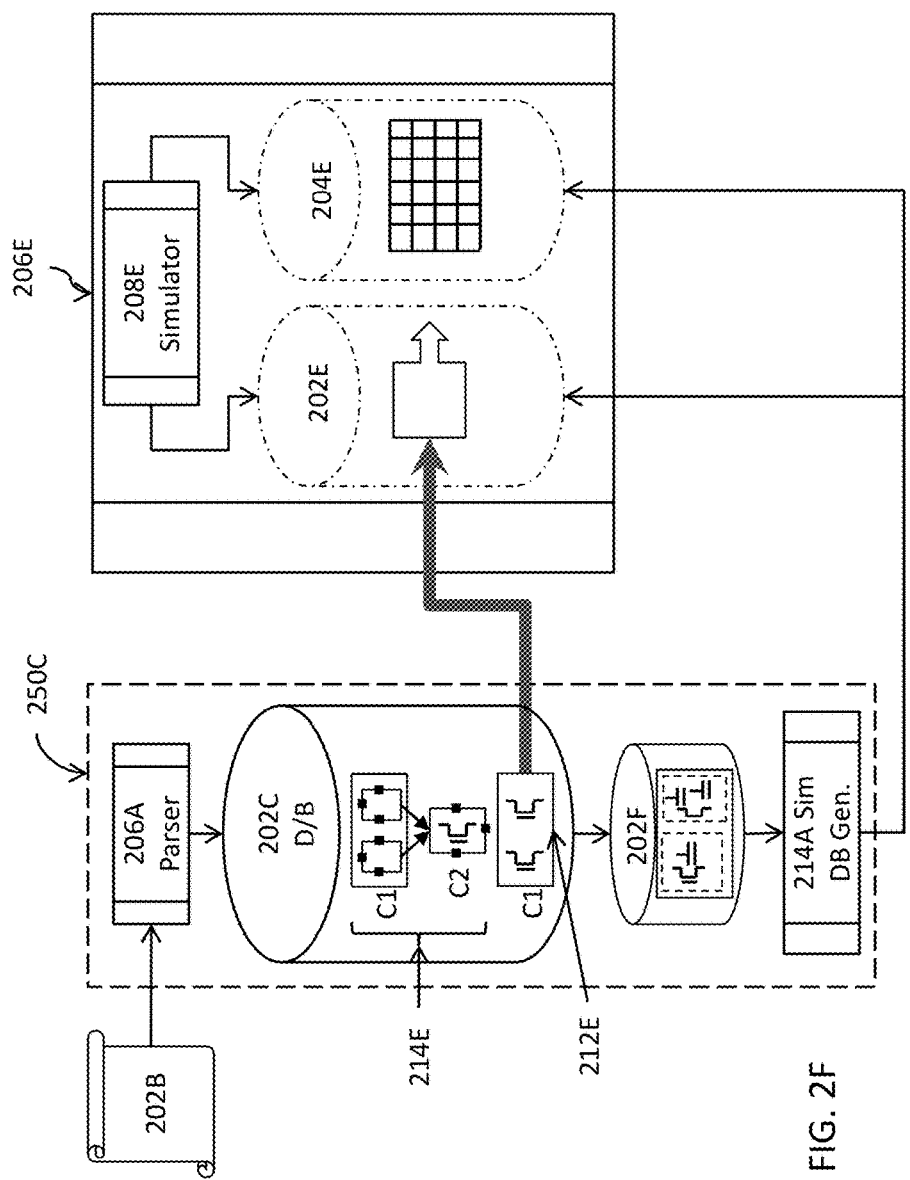
FIG. 2F illustrates another more detailed block diagram of a simulation platform including a simulation frontend and a simulation backend in one or more embodiments.

FIG. 2F illustrates more details about a simulation platform including a simulation frontend 250C and a simulation backend 206E in some embodiments. In these embodiments, the transient copy of the flat connectivity (e.g., 210E in FIG. 2E) is no longer maintained in the compiled model interface 202E. Rather, the flat connectivity 212E in the persistent database 202C is referenced by the compiled model interface 202E to further reduce the memory footprint.

FIG. 2F further illustrates that the simulation frontend 250C includes a library of complex models 202F that includes, for example, cells or blocks that may be coded in, for example, one or more high-level programming languages (e.g., C, C++, etc.) and compiled into and stored as objects that may be dynamically linked rather than statically embedded (e.g., via direct specification of structures of a parameterized cell with respect to multiple, different parameter values in a textual netlist). This library of complex models 202F may include, for example, parameterized cells that also store connectivity information in one or more of the compiled objects, and the connectivity may be referenced by calling these one or more objects without parsing with a parser (e.g., 206A). With respect to configurations of devices or cells, the compiled model interface 202E may be implemented as an overlay on top of the database block domain, and the simulators only need to reference the database (e.g., the persistent database 202C) to retrieve object names in some embodiments. As a result, the compiled model interface 202E not only leads to reduction in memory footprint but also reduction in simulation runtime.

Figure 2G:
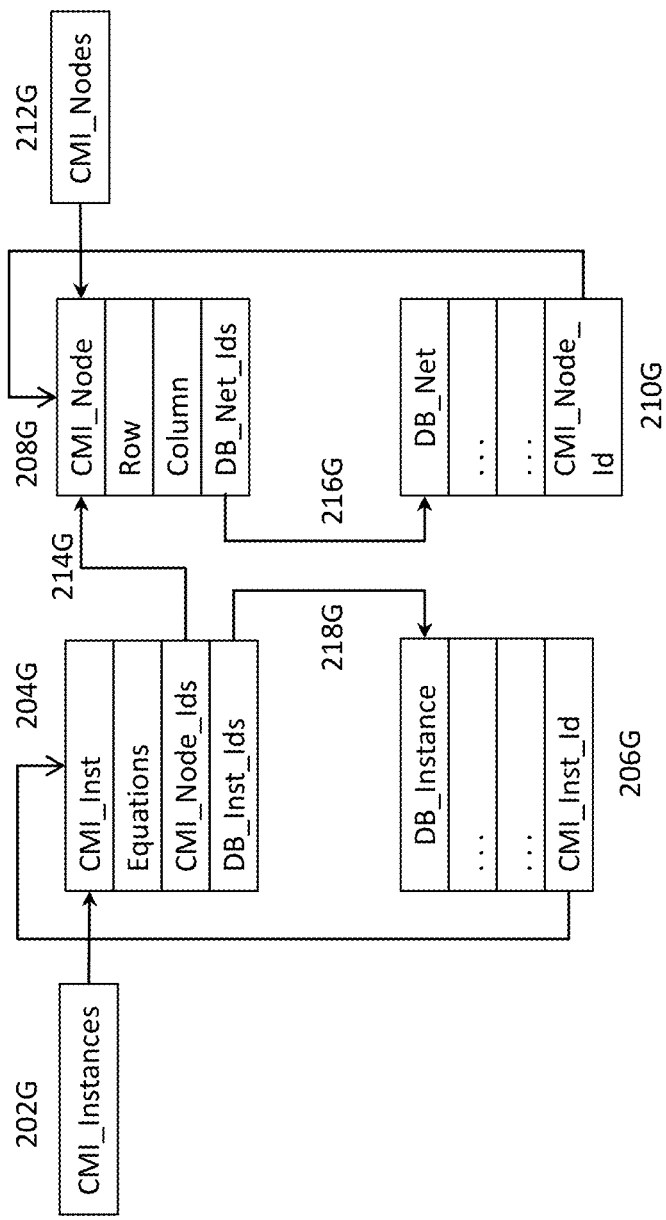
FIG. 2G illustrates an example of how a compiled model interface may be implemented as an overlay on top of the design database in one or more embodiments.

FIG. 2G illustrates an example of how a compiled model interface may be implemented as an overlay on top of a design database in some embodiments. For an instance in the compiled model interface (CMI) 202G in this example, a lightweight overlay 204G may be created for each instance 206G of a set of instances while providing a pointer 218G pointing from, for example, an instance identifier or identification ("DB_Inst-Ids") in the overlay 204G to the corresponding database instance ("DB_Instance") in 206G. The instance may further optionally include a CMI instance identifier or identification as shown in FIG. 2G to link to the corresponding CMI instance.

The CMI instance 204G may further include or be associated with other information including, for example, one or more equations (e.g., "Equations"), node identifiers ("CMI_Npde_Ids"), and/or database instance identifications or identifiers (e.g., "DB_Inst_Ids") in some embodiments. Similarly, an overlay 208G may also be created for a net (e.g., "DB_Net") in 210G in the database with a pointer 216G pointing to the database net identifier or identification (e.g., "DB_Net_Ids") in the overlay 208G. The net 210G may further optionally include a CMI node identifier or identification as shown in FIG. 2G to link to the corresponding CMI node.

The overlay 208G for a node in the CMI may further include, for example, the row number and column number (e.g., "Row" and "Column") of the node and or the database net identifier(s) or identification(s) (e.g., "DB_Net_Ids") in some embodiments. This information may be obtained from the CMI nodes table 212G. A pointer 214G may also be created to link the instance overlay 204G to the node overlay 208G for pointing to all the node identifications or identifiers (e.g., "CMI_Node_Ids") in the CMI instance included in 204G in the compiled model interface (CMI) instance to the corresponding nodes (e.g., "CMI_Node") in the overlay 208G that are further associated with all the nodes (e.g., "CMI_Nodes") in 212G.

Figure 3A:
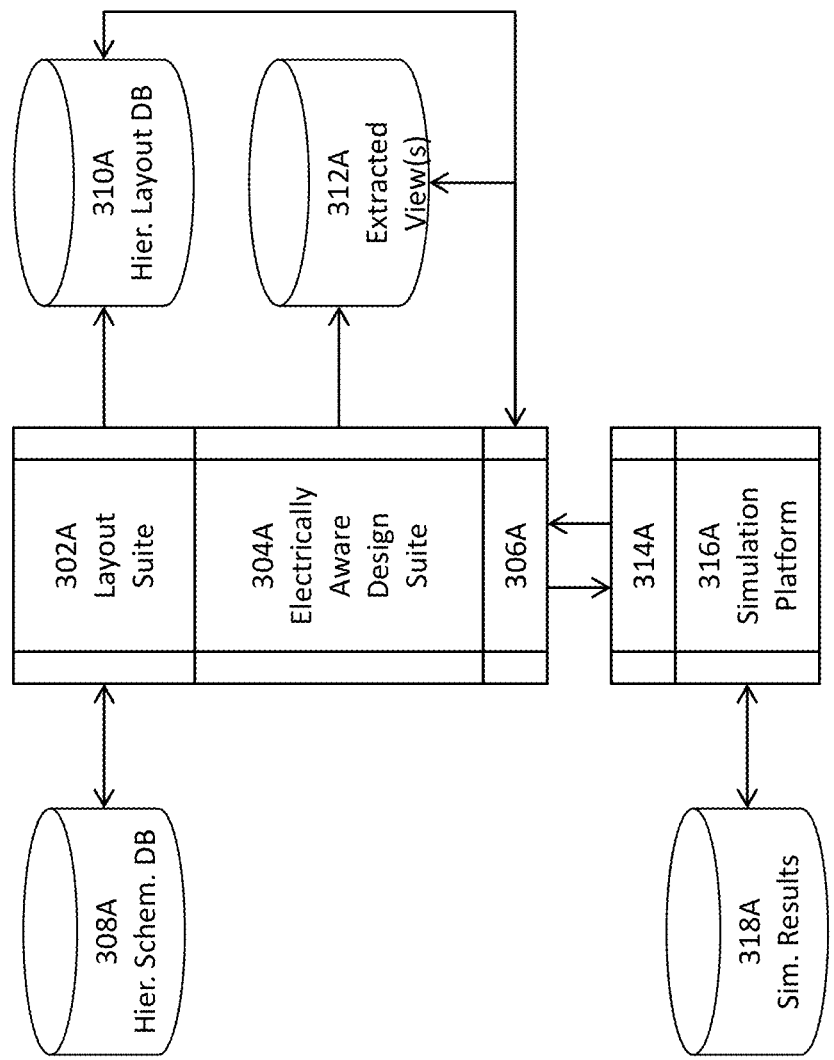
FIG. 3A illustrates an extension of a simulation platform described herein to an electrically aware design suite in one or more embodiments.

FIG. 3A illustrates another extension of the simulation platform to electrically aware design suite in some embodiments. In these embodiments, the layout suite 302A operatively coupled with the electrically aware design suite 304A may include an incremental database update interface 306A that allows two or more processes operating on the same database to send incremental changes to each other while ensuring the consistency and integrity of the database.

The layout suite 302A is also operatively connected to a hierarchical schematic database 308A to receive schematic design data and to forward or back annotate the hierarchical schematic design database 308A with data or information (e.g., parasitic information, geometric information, etc.) from the hierarchical layout database 310A generated by the layout suite 302A. The hierarchical layout database 310A may also be associated with electrical information or characteristics (e.g., currents, voltages, etc.) from the hierarchical schematic database 308A.

The electrically aware design suite 304A generates extracted views or data 312A with data or information from the hierarchical schematic database 308A and/or the hierarchical layout database 310A. A hierarchical extracted view may include an embedded module hierarchy (EMH) based extracted view and includes a result set of a database query performed on the design data of a design database. A hierarchical extracted view described herein is in sharp contrast with conventional extracted views that are flat in structure. In some embodiments, a hierarchical extracted view may include or represent a subset of the entire set of design data in a design database. Multiple hierarchical extracted views may be joined into a single data structure (e.g., a single virtual table).

A hierarchical extracted view may also act as aggregated tables and may transparently partition an actual underlying database table by hiding a portion of the data in the hierarchical extracted view. One of the advantages of using a hierarchical extracted view is that the database may include only a definition of the hierarchical extracted view but not the actual data represented by the hierarchical extracted view. In some embodiments, one or more extracted views may be used to interact with, for example, a physical design tool (e.g., a layout suite), an electrically aware design suite, and/or one or more simulators to incrementally update the design database and iteratively perform simulations and/or re-simulations with the incremental updates.

Data from either or both the layout suite 302A and the electrically aware design suite 304A may be forwarded from the incremental database update interface 306A of the layout suite 302A and/or the electrically aware design suite 304A to the incremental database update interface 314A of a simulation platform 316A which performs various simulations or analyses for an electronic design of interest to generate simulation or analysis results 318A. The simulation platform 316A may also update the extracted views or data 312A by transmitting various physical, electrical, and/or parasitic properties, characteristics, annotations, modifications, etc. generated by the simulation platform 316A through the incremental database update interface (306A and/or 314A) to the extracted views or data 312A.

The capability of transmitting incremental changes between the simulation platform 316A and the hierarchical layout database 310A and/or the extracted views or data 312A provides the additional ability for the layout suite 302A and the electrically aware design suite 304A to perform on-demand simulation with the updated layout data or extracted views or data as well as the ability to perform incremental update on the layout database 310A, the extracted views or data database 312A, and the connectivity, matrix representation, and simulation input in a bi-directional manner.

Figure 3B:
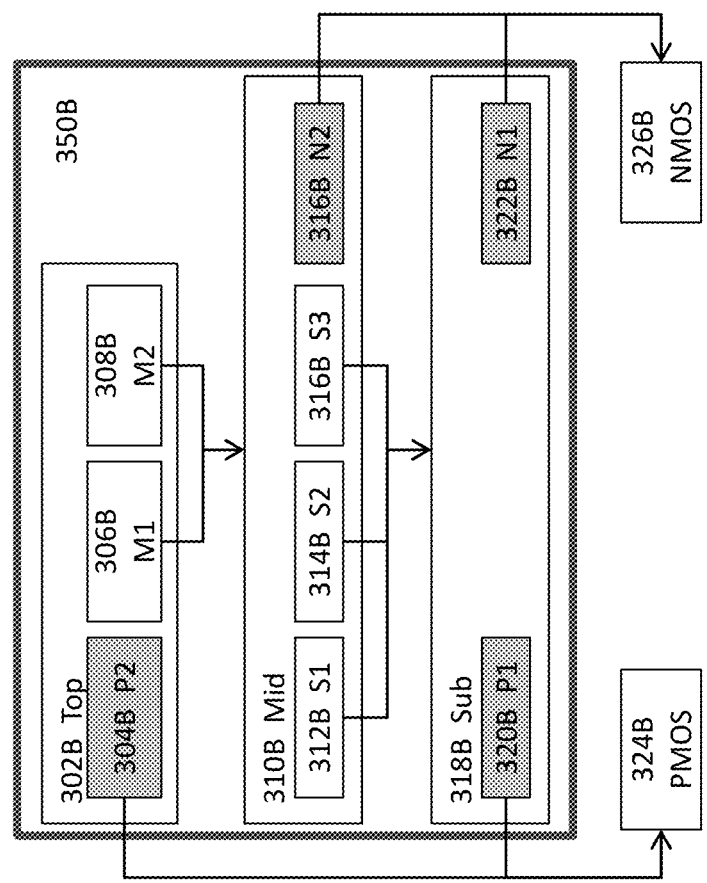
FIG. 3B illustrates some examples of using fully embedded devices in a simulation platform described herein in one or more embodiments.
Figure 3C:
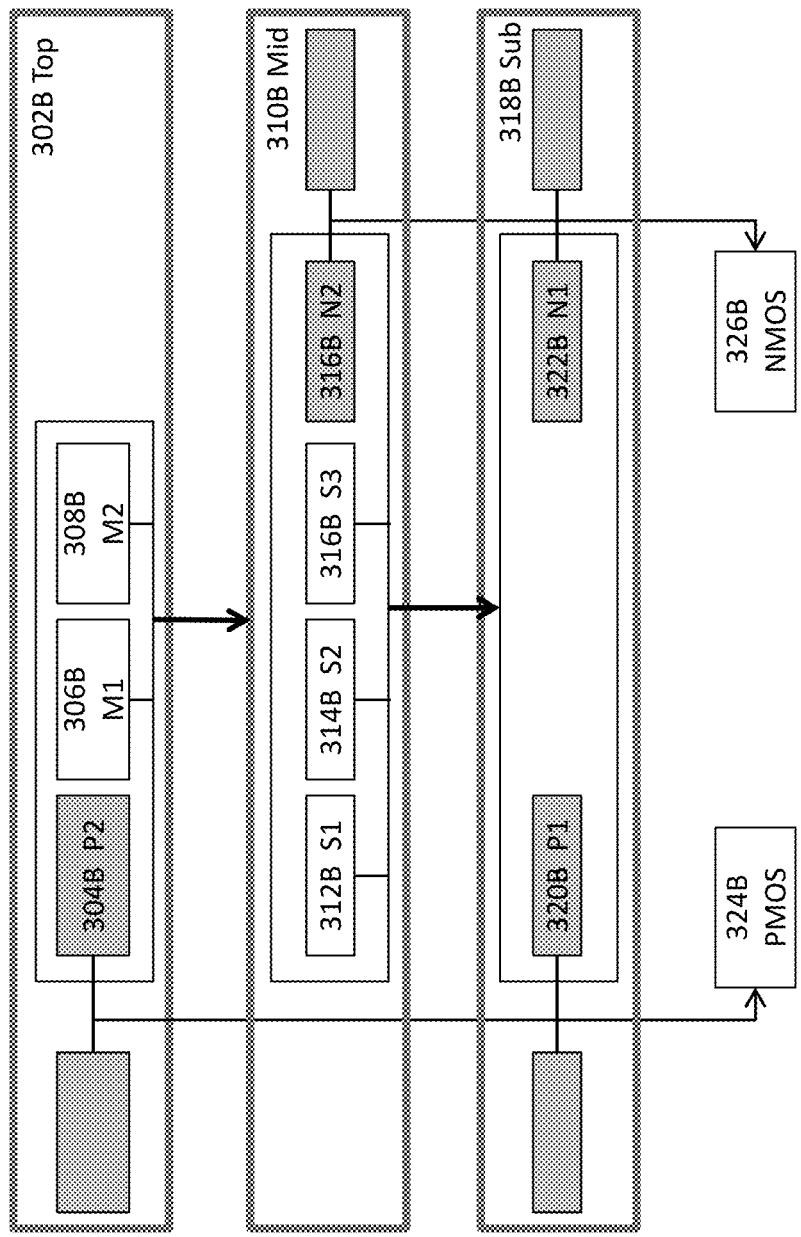
FIG. 3C illustrates some examples of using fully detached devices in a simulation platform described herein in one or more embodiments.

FIG. 3D illustrates choices of implementations for devices that may be used in the simulation platform for better runtime and/or memory consumption in some embodiments. A device may be implemented in a fully embedded manner as shown in FIG. 3B, in a fully detached manner as shown in FIG. 3C, or in a partially embedded and partially detached manner. More specifically, all the hierarchies—the Top instance 302B at the highest hierarchy, the Mid instance 310B in the middle hierarchy, and the Sub instance 318B in the lowest hierarchy—are included in the same, single design 350B. The Top instance 302B includes an instance P2 304B of a PMOS (p-channel metal-oxide semiconductor) master 324B and two instances M1 306B and M2 308B of the Mid instance.

Each of the instances M1 306B and M2 308B is linked to the Mid instance 310B that is also included in the same single design. The Mid instance 310B includes three instances S1 312B, S2 314B, and S3 316B of the Sub instance 318B as well as an instance N2 316B of the NMOS (n-channel metal-oxide semiconductor) master 326B. Each of the instances 312B, 314B, and 316B is linked to the Sub instance 318B that is also included in the same, single design 350B. The Sub instance 318B includes an instance P1 320B of the PMOS master 324B and an instance N1 of the NMOS master 326B. When the single design 350B is unfolded, the portion that is unfolded is added to the single design 350B.

For the fully detached example illustrated in FIG. 3C, the same electronic design includes multiple designs for the Top instance 302B at the highest hierarchical level, the Mid instance 310B at the middle hierarchical level, and the Sub instance 318B at the lowest hierarchical level, where each instance includes the same instances and design components as illustrated in FIG. 3B. Each instance (302B, 310B, or 318B) is stored as a separate design in a fully detached design. During unfolding, the detail design data are added to the respective design. For example, if the Mid instance 310B is to be unfolded, the details of the instance 318B will be added to the respective design for the instance 310B while the other separate designs for 302B and 318B remain unchanged.

As FIG. 3D shows, for analyses without the Monte Carlo mismatch analysis and without the parasitic annotation, folded, fully detached implementation may be desired. For analyses including at least one of the Monte Carlo mismatch analysis and the parasitic annotation, unfolded, fully embedded implementation may be desired in these embodiments.

Figure 4:
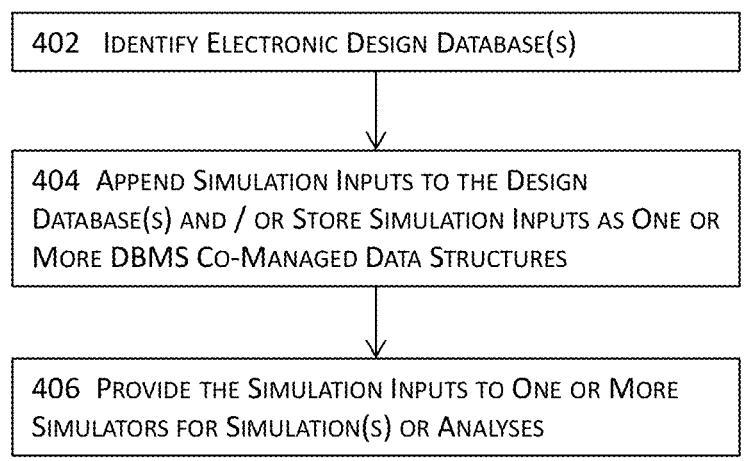
FIG. 4 illustrates a high level block diagram for implementing a simulation platform with dynamic device model libraries in one or more embodiments.

FIG. 4 illustrates a high level block diagram for implementing a simulation platform with dynamic device model libraries in one or more embodiments. In these one or more embodiments, one or more electronic design databases may be identified at 402. These one or more electronic design databases may span across multiple design fabrics such as an IC (integrated circuit) design fabric, an IC package design fabric, a PCB (printed circuit board) design fabric, a testbench design fabric, etc. in some of these embodiments.

These one or more electronic design databases may include, for example, one or more schematic design databases (e.g., an IC schematic database, an IC package schematic database, a PCB schematic database, etc.), one or more layout databases (e.g., an IC layout database, an IC package layout database, a PCB layout database, etc.) In some embodiments where electronic design databases span across multiple design fabrics, data access, manipulation, generation, and/or modification may be handled in a multi-fabric design environment.

In some of these embodiments described with reference to at least FIG. 4, these one or more electronic design databases are managed by a database management system (DBMS), instead of multiple different database management systems. An example of such a database management system may include, for example, OpenAccess by Silicon Integration Initiative, Inc. (Si2).

Conventional simulations require, for example, textual netlists and textual parasitic information (e.g., parasitic information in the SPEF, DSPF, RSPF, SPF, SBPF, etc. format) as input to one or more simulators and thus require parsing an electronic design to generate connectivity information, extracting parasitic information, stitching the parasitic information, and translating the generated connectivity information stitched with the extracted parasitic information into the requisite format for the one or more simulators.

These processes of parsing, extracting, stitching, and translating or transforming are repeated performed, especially when the electronic design (e.g., schematic design, layout, or both) is changed or when the simulation is performed in a distributed computing environment or a parallel computing environment. In contrast, simulation inputs may be appended to the one or more design databases in some embodiments. For example, these techniques described herein may determine the simulation inputs and append the determined simulation inputs to, for example, the schematic design database, the layout database, or an in-memory instance thereof.

In some embodiments, these simulation inputs may be stored as one or more data structures (e.g., database tables instead of some textual files) that are separate from the one or more design database, and these one or more data structures may be associated with the one or more design databases and co-managed by the same database management system (e.g., the database management system for OpenAccess by Si2) that also manages the one or more design databases.

In some other embodiments, these simulation inputs may be partially appended to the one or more design databases and partially stored as one or more data structures that are co-managed by the same database management system of the one or more design databases. In these embodiments, an electronic design may be manipulated (e.g., edited, modified, etc.) while the changes in the electronic design may be automatically reflected or populated in the corresponding entries (e.g., when some of the simulation inputs are appended to the one or more design databases) or the one or more corresponding data structures (e.g., when some of the simulation inputs are stored as one or more separate data structures) by using the respective EDA tools as well as the associations between the changes in the one or more design databases and the corresponding entries or one or more separate DBMS co-managed data structures.

When these simulation inputs are needed for the one or more simulators, these simulation inputs may be directly provided to the one or more simulators. This is especially beneficial in a distributed or parallel computing environment because the computing nodes in these environments need not repeatedly perform the processes of parsing, extracting, stitching, and translating or transforming. In some embodiments, the simulation inputs may include, for example, hierarchical connectivity data in one or more schematic domains such as hierarchical netlists, flat connectivity data such as flat netlists in one or more schematic domains, matrix representations for electronic designs or portions thereof, parasitic information, or any combinations thereof.

In these embodiments, these simulation inputs may be provided to one or more simulators for schematic level simulations or analyses in one or multiple design fabrics. In some embodiments, simulation inputs may include, for example, hierarchical connectivity data in one or more physical domains such as hierarchical netlists, parasitic information in one or more physical domains, one or more extracted views, or any combinations thereof. In these embodiments, at least some of these simulation inputs may be provided to one or more simulators for physical domain simulations or analyses in one or more design fabrics. At 406, at least some of the simulation inputs appended to those one or more design databases or stored in one or more separate DBMS co-managed data structures may be provided to one or more simulators as inputs to perform one or more simulations or analyses in one or multiple design fabrics.

Figure 5B:
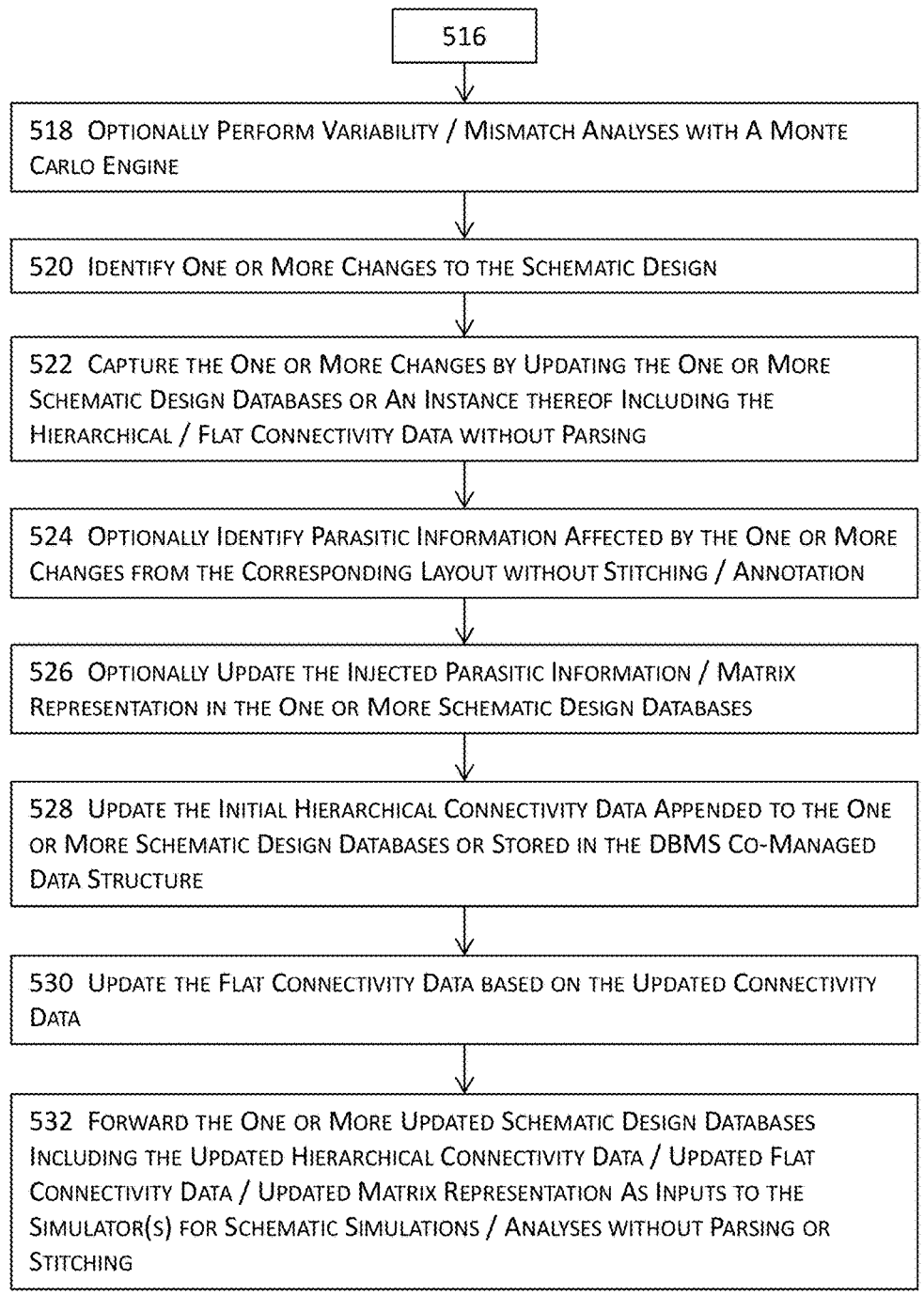

FIGS. 5A-B jointly illustrate a more detailed block diagram for implementing a simulation platform with dynamic device model libraries in one or more embodiments. More specifically, FIGS. 5A-B jointly illustrate a more detailed block diagram for a pre-layout simulation platform with dynamic device model libraries in these one or more embodiments.

It shall be noted that the term "pre-layout" does not necessarily mean a layout for an electronic design is not yet created, completed, or available. Rather, a pre-layout simulation platform includes the modules and modules to perform various simulations and/or analyses on an electronic design regardless of whether the layout of the electronic design is created, completed, or available. In some embodiments where the layout or a partial, incomplete portion thereof is available, the pre-layout simulation platform may leverage the availability of physical design data and hence the availability of the corresponding parasitic information, at least to the extent that the physical design data exists.

In these embodiments, the pre-layout simulation platform may perform various simulations or analyses on an electronic design with knowledge or awareness of the parasitic information. In some other embodiments where a layout is not yet created or is incomplete in the sense that the design data of some design components do not even exist in the layout or the corresponding physical design databases, the pre-layout simulation platform may perform various simulations or analyses on an electronic design without knowledge or awareness of the parasitic information for at least the design components whose physical design data are not yet available or for the entire layout.

In these one or more embodiments, schematic design data may be identified at 502 from one or more schematic designs in one or more design fabrics at 502. For example, schematic design data may be identified from an IC schematic database, an IC package schematic design database, a PCB schematic design database, a testbench schematic design database, or any combinations thereof in one or multiple design fabrics.

The schematic design data may be hierarchical in some embodiments or flat in some other embodiments. The schematic design data may also be fully embedded, fully detached, or partially embedded and partially detached. Parasitic information may be optionally identified or received at 504 from a corresponding layout, if the corresponding layout is available. It shall be noted that the corresponding layout is not necessarily available or complete. In some embodiments, the parasitic information may be incrementally introduced by running an extraction and stitching or annotation process to populate the one or more schematic design database with the parasitic information of incrementally added or modified physical design components as the layout is being designed.

The parasitic information optionally identified or received at 504 may be optionally injected at 506 into the one or more schematic design databases. The injection of parasitic information may be performed via, for example, a stitching or annotation process in some embodiments. It shall be noted that the extraction of parasitic information via parsing a layout or a portion thereof and subsequent stitching or annotations may need to be performed only once during the population of the parasitic information to the one or more schematic design databases. Once all the parasitic information is fully populated into the one or more schematic design databases, the populated parasitic information may be maintained with the respective schematic design tools for the corresponding design fabrics.

Initial hierarchical connectivity data may be generated at 508 for the schematic design data. For example, a hierarchical netlist may be generated at 508 for the schematic design data identified at 502. The generated initial hierarchical connectivity data may be appended to the one or more schematic design databases in some embodiments or stored as one or more separate data structures that are co-managed by the same database management system that also manages the one or more schematic design databases in some other embodiments.

In some other embodiments, a portion of the hierarchical connectivity data may be appended to the one or more schematic design database, while the remaining portion may be stored as one or more separate DBMS co-managed data structures. In some embodiments where multiple design fabrics are involved in the hierarchical connectivity data, the respective native EDA design tools may be used to natively access or otherwise manipulate the connectivity data in their respective design fabrics by using the multi-fabric design environment.

Flat connectivity data may also be generated at 512 based in part or in whole upon the hierarchical connectivity data. For example, a flat netlist may be generated at 512 based in part or in whole upon the hierarchical connectivity data generated at 508. The generated flat connectivity data based on the hierarchical connectivity data may be appended to the one or more schematic design databases in some embodiments or stored as one or more separate data structures that are co-managed by the same database management system that also manages the one or more schematic design databases in some other embodiments.

In some other embodiments, a portion of the flat connectivity data may be appended to the one or more schematic design database, while the remaining portion may be stored as one or more separate DBMS co-managed data structures. In some embodiments, the flat connectivity data may be stored in a single database or a single instance thereof (e.g., a schematic database or an in-memory instance thereof at the frontend of the simulation platform) without being duplicated in other parts of the simulation platform (e.g., the backend including or operatively coupled to the one or more simulators to provide simulation inputs of the simulation platform).

In these embodiments, the simulation backend or the one or more simulators therein may gain access to the flat connectivity data from the simulation platform frontend. The elimination of the flat connectivity data and hence the data structure (e.g., an instance of the schematic database) from the backend further reduces the in-memory footprint of the simulation platform. In some other embodiments, a copy of the flat connectivity data may be separately stored in a separate database instance (e.g., an in-memory instance of a schematic database accessible by the frontend of the simulation platform).

In these embodiments, the simulation backend or the one or more simulators operatively coupled therewith may gain access from the copy of the flat connectivity data stored in the separate in-memory instance of the schematic database.

The addition of the flat connectivity data in the backend of the simulation platform reduces, for example, the network round-trip between the backend and the frontend of the simulation platform and hence enhances the I/O (input/output) and processing of the simulation platform in these latter embodiments.

At 514, a matrix representation for the schematic design data may be generated. For example, a matrix representation (e.g., [ ][x]=[z], where [A] is (N+M)×(N+M) in size and includes known quantities; [x] is a (N+M)×1 vector and includes unknown variables such as current variables, and [z] is a (N+M)×1 vector and includes known quantities such as voltages for the electronic circuit having N circuit nodes and M independent voltage sources) for the schematic design data may be generated based on the Kirchhoff's voltage law, Kirchhoff's current law, or the branch constitutive equations.

The generated matrix representation may be appended to the one or more schematic design databases in some embodiments or stored as one or more separate data structures that are co-managed by the same database management system that also manages the one or more schematic design databases in some other embodiments. At 516, the one or more schematic databases or the requisite data (e.g., the hierarchical connectivity data, the flat connectivity data, and/or the matrix representation) included therein may be forwarded to one or more simulators as an input for one or more schematic simulations or analyses.

One or more variability or mismatch analyses may be optionally performed with a Monte Carlo engine at 518 by, for example, injecting variability or deltas into the design so that the devices in an electronic design are not entirely identical in the analyses or simulation of electronic design with multiple coupled degrees of freedom to determine, for example, the probabilistic interpretation of one or more characteristics of the electronic design. At 520, one or more changes to the electronic design may be identified. These one or more changes may be a result of modifications of a schematic design, modifications of a physical design, simulations or analyses, and/or optimizations.

For example, a schematic design may be modified by a designer's own initiative, according to some simulation or analysis results, as a result of design optimizations, or based on an engineering change order (ECO). The one or more changes may be captured at 522 by updating the schematic design database or an instance thereof that includes the hierarchical and/or flat connectivity data.

The injected parasitic information or matrix representation that is affected by the one or more changes may also be optionally identified at 524 from the corresponding layout without any additional stitching or annotation. In addition, the injected parasitic information or matrix representation may be optionally updated at 526 in the one or more schematic design databases. As described earlier, the capturing of these one or more changes and the update of parasitic information and the matrix representation require no parsing of the electronic design or stitching or annotating the parasitic information and may be accomplished by directly updating the one or more schematic design databases once the initial population of schematic design data (and optionally parasitic information, if available) is complete. Instead, the respective, native EDA schematic design tools in one or more design fabrics may be used to natively edit their corresponding schematic design data.

The initial hierarchical connectivity data that is appended to the one or more schematic design databases or stored as one or more DBMS co-managed data structures may be updated into updated connectivity data at 528. Similarly, the flat connectivity data may be updated at 530 based in part or in whole upon the updated connectivity data. As described above, updating the hierarchical and/or flat connectivity data requires no parsing of the electronic design or stitching or annotating the hierarchical and/or flat connectivity data and may be accomplished by directly updating the one or more schematic design databases once the initial population of the initial hierarchical and/or flat connectivity data is complete.

At 532, the one or more schematic databases or the requisite data (e.g., the updated hierarchical connectivity data, the updated flat connectivity data, the updated parasitic information, and/or the updated matrix representation) included therein may be forwarded to one or more simulators as an input for one or more schematic simulations or analyses. In these one or more simulations or analyses at 532, the one or more simulators may access the requisite data from the one or more schematic design databases or one or more corresponding instances thereof, without performing any parsing, stitching, annotation, or elaboration on the electronic design of interest in some embodiments.

Figure 5C:
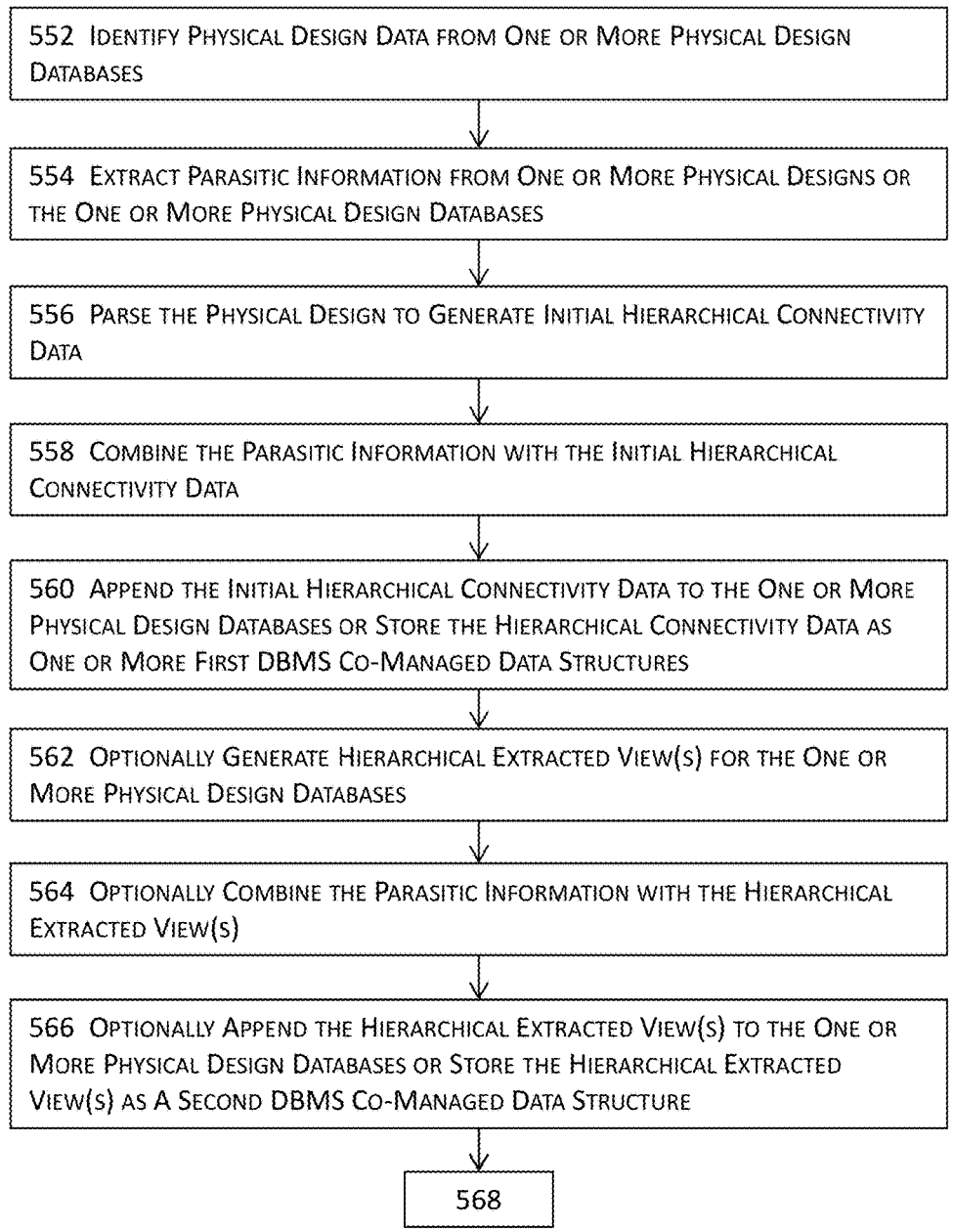
FIGS. 5C-5D jointly illustrate a more detailed block diagram for implementing a simulation platform with dynamic device model libraries in one or more embodiments.
Figure 5D:
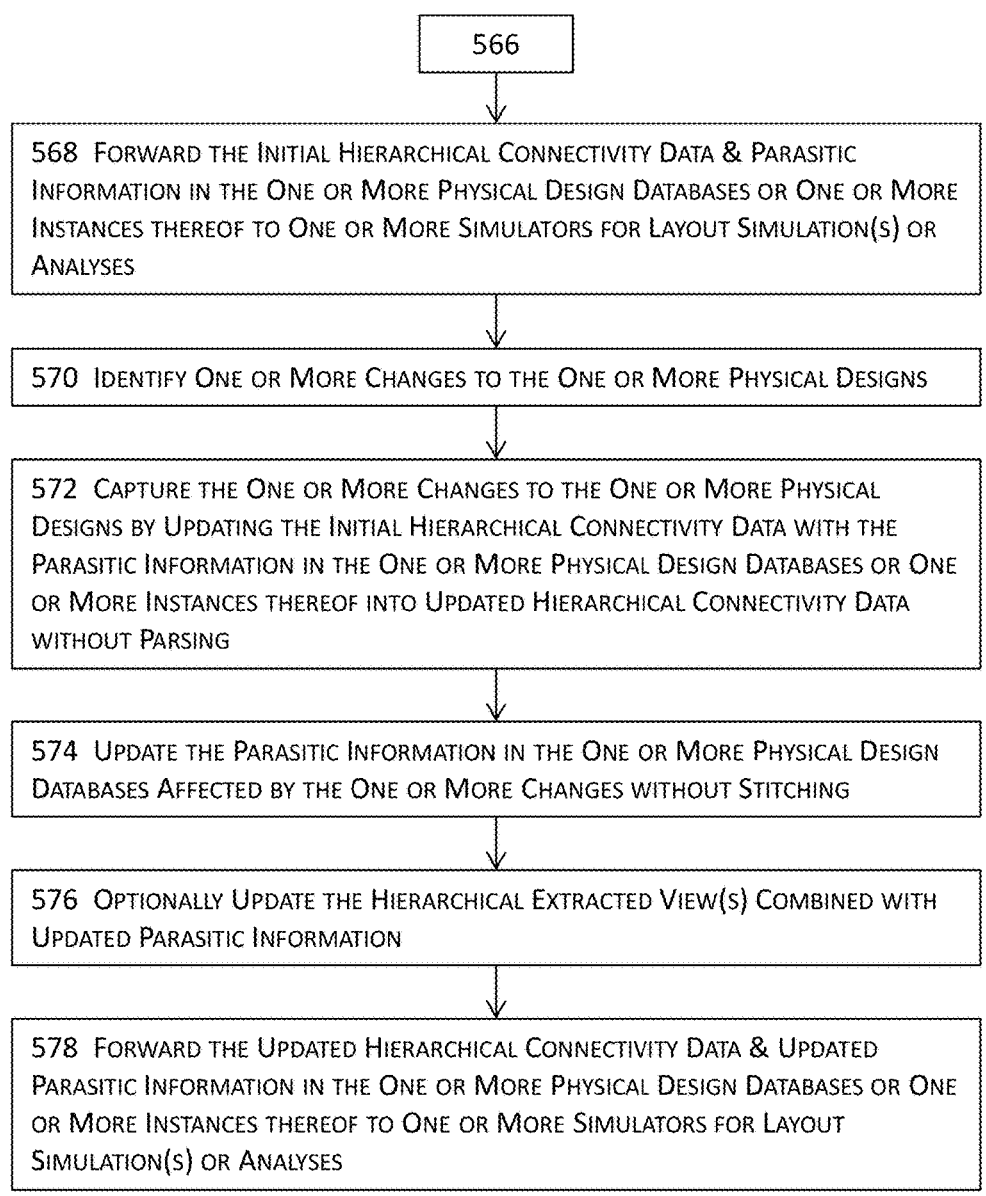

FIGS. 5C-D jointly illustrate a more detailed block diagram for implementing a simulation platform with dynamic device model libraries in one or more embodiments. More specifically, FIGS. 5C-D jointly illustrate a more detailed block diagram for a post-layout simulation platform with dynamic device model libraries in these one or more embodiments. It shall be noted that the term "post-layout" generally includes the embodiments where a layout for an electronic design is available although the available layout is not necessarily complete and thus may include only a smaller portion of the final layout of the entire electronic design of interest.

In these one or more embodiments, physical design data may be identified at 552 from one or more physical design databases. In some of these embodiments, the one or more physical design databases may span across multiple design fabrics and include, for example, an IC physical design database, an IC package physical design database, a PCB physical design database, a testbench physical design database, or any combinations thereof. Parasitic information may be extracted at 554 from one or more physical designs or the one or more physical design database.

A physical design may be parsed at 556 to generate initial hierarchical connectivity data. For example, a layout may be parsed to generate an initial netlist. In some embodiments, the initial hierarchical connectivity data generated at 554 may also be combined with parasitic information at 558. The initial hierarchical connectivity data may be appended to the one or more physical design databases or may be stored as one or more first data structures (e.g., one or more database tables) that are co-managed by the same database management system that also manages at least one of the one or more physical design databases at 560.

One or more hierarchical extracted views may be optionally generated at 562 for the one or more physical design databases or one or more corresponding portions thereof. As described above with reference to FIG. 3A, a hierarchical extracted view may include an embedded module hierarchy (EMH) based extracted view and includes a result set of a database query performed on the design data of a design database. A hierarchical extracted view described herein is in sharp contrast with conventional extracted views that are flat in structure. In some embodiments, a hierarchical extracted view may include or represent a subset of the entire set of design data in a design database. Multiple hierarchical extracted views may be joined into a single data structure (e.g., a single virtual table).

A hierarchical extracted view may also act as aggregated tables and may transparently partition an actual underlying database table by hiding a portion of the data in the hierarchical extracted view. One of the advantages of using a hierarchical extracted view is that the database may include only a definition of the hierarchical extracted view but not the actual data represented by the hierarchical extracted view. In some embodiments, one or more extracted views may be used to interact with, for example, a physical design tool (e.g., a layout suite), an electrically aware design suite, and/or one or more simulators to incrementally update the design database and iteratively perform simulations and/or re-simulations with the incremental updates.

At 564, the parasitic information extracted at 556 may be optionally combined with the one or more hierarchical extracted view generated at 562. At 566, these one or more hierarchical extracted views may then be optionally appended to the one or more physical design databases or stored as one or more separate data structures that are co-managed by the same database management system (e.g., the database management system for OpenAccess by Si2) that also manages the one or more physical design databases. The one or more physical design databases or the appended or stored initial hierarchical connectivity data, the parasitic information, and/or the hierarchical extracted views may be forwarded at 568 to one or more simulators for layout simulations, analyses, or optimizations.

One or more changes to at least one of the one or more physical designs may be identified at 570. These one or more changes may be a result of modifications of the at least one physical design, modifications of one or more schematic designs, or modifications or fixes result from simulations or analyses, and/or optimizations. For example, a physical design may be modified by a designer's own initiative, according to some simulation or analysis results, as a result of design optimizations, or based on an engineering change order (ECO).

These one or more changes may be captured at 572 at least by updating the hierarchical connectivity data in the one or more physical design databases or one or more corresponding instances thereof into updated hierarchical connectivity data. The parasitic information in the one or more physical design databases or one or more corresponding instances thereof may also be updated at 574 when the one or more changes merit such an update. It shall be noted that the capturing of these one or more changes and the updates of parasitic information and the hierarchical connectivity data require no parsing of the one or more physical electronic designs or stitching or annotating the updated parasitic information and may be accomplished by directly updating the one or more physical design databases once the initial population of physical design data, parasitic information, and connectivity into the one or more physical design database is complete.

The one or more hierarchical extracted views optionally generated at 562 may also be optionally be updated into one or more updated hierarchical extracted views in some embodiments. In some of these embodiments, the updated parasitic information may also be combined with the one or more updated hierarchical extracted views by, for example, updating the corresponding definitions of the one or more updated hierarchical extracted views in some embodiments or by re-executing the one or more corresponding queries in some other embodiments.

The one or more updated physical design databases or the appended or stored updated hierarchical connectivity data, the updated parasitic information, and/or the one or more updated hierarchical extracted views may be forwarded at 578 to one or more simulators for layout simulations, analyses, or optimizations. In these one or more simulations or analyses at 578, the one or more simulators may access the requisite data from the one or more physical design databases or one or more corresponding instances thereof, without performing any parsing, stitching, annotation, or elaboration on the one or more physical electronic design of interest in some embodiments.

System Architecture Overview

Figure 6:
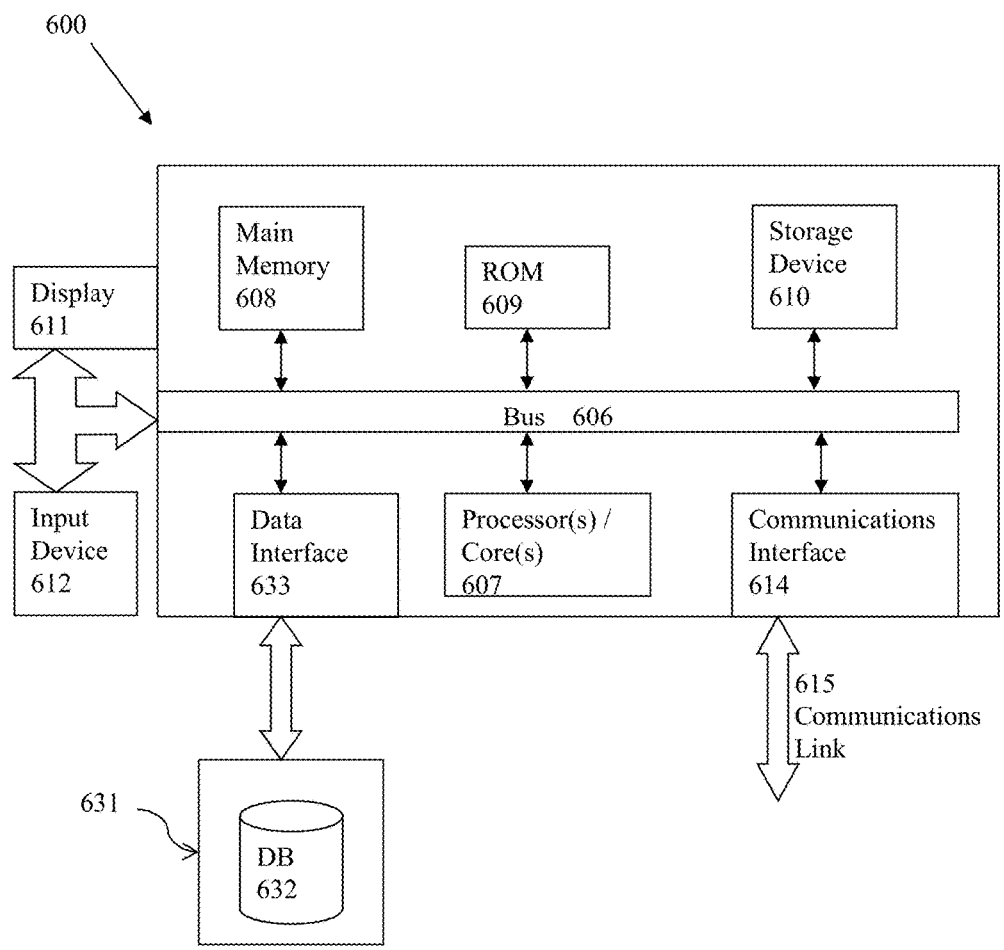
FIG. 6 illustrates a computerized system on which a method for implementing a simulation platform with dynamic device model libraries may be implemented.

FIG. 6 illustrates a block diagram of a simplified illustration of a computing system 600 suitable for FIG. 6 illustrates a computerized system on which a method for implementing a simulation platform with dynamic device model libraries as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for implementing a simulation platform with dynamic device model libraries, comprising:
   identifying one or more design databases stored in a non-transitory computer accessible storage medium and managed by a database management system on a computing system for an electronic design;
   appending simulation inputs to the one or more design databases or storing the simulation inputs as one or more separate data structures that are co-managed by the database management system that also manages the one or more design databases; and
   performing one or more simulations, analyses, or optimizations at a first level with at least a compiled model interface that allows high-level programming language inputs and functions in tandem with the database management system including the simulation inputs at one or more simulation engines.

2. The computer implemented method of claim 1, the process further comprising:
   identifying hierarchical schematic design data from the one or more design databases including at least one schematic design database; and
   generating initial hierarchical connectivity data for the hierarchical schematic design data.

3. The computer implemented method of claim 2, the process further comprising:
   identifying parasitic information from the one or more design databases including at least one physical design database for the electronic design in one or more design fabrics; and
   injecting the parasitic information into at least one of the one or more design databases.

4. The computer implemented method of claim 2, the process further comprising:
   appending the initial hierarchical connectivity data to at least a first design database of the one or more design databases or storing the initial hierarchical connectivity data as one or more first database management system co-managed data structures that are co-managed by the database management system.

5. The computer implemented method of claim 4, the process further comprising:
   generating flat connectivity data based in part or in whole upon the initial hierarchical connectivity data; and
   appending the flat connectivity data to at least one design database of the one or more design databases or storing the flat connectivity data as one or more second database management system co-managed data structures that are co-managed by the database management system.

6. The computer implemented method of claim 5, the process further comprising:
   generating a matrix representation for the electronic design; and
   appending the matrix representation to one or more design databases of the one or more design databases or storing the matrix representation as one or more third database management system co-managed data structures that are co-managed by the database management system.

7. The computer implemented method of claim 6, the process further comprising:
   forwarding at least a portion of the one or more design databases including the initial hierarchical connectivity data, the flat connectivity data, and the matrix representation as the simulation inputs to the one or more simulation engines for performance of the one or more simulations, analyses, or optimizations.

8. The computer implemented method of claim 2, the process further comprising:
   identifying one or more changes to one or more schematic designs;
   capturing the one or more changes at least by updating the one or more design databases or one or more instances thereof;
   updating the initial hierarchical connectivity data that are appended to the one or more design databases or stored in the one or more separate data structures into updated hierarchical connectivity data without parsing the electronic design or a portion thereof; and
   updating flat connectivity data that are appended to the one or more design databases or stored in the one or more separate data structures into updated flat connectivity data without parsing the electronic design or the portion thereof.

9. The computer implemented method of claim 8, the process further comprising:
    identifying at least a portion of the parasitic information affected by the one or more changes; and
    updating the at least the portion of the parasitic information that is appended to the one or more design databases or stored in the one or more separate data structures into updated parasitic information without stitching or annotating the updated parasitic information.

10. The computer implemented method of claim 9, the process further comprising:
    forwarding the one or more databases including the updated hierarchical connectivity data, the updated flat connectivity data, and an updated matrix representation as the simulation inputs to the one or more simulation engines for performance of the one or more simulations, analyses, or optimizations.

11. The computer implemented method of claim 1, the process further comprising:
    performing one or more variability or mismatching analyses by injecting deltas into the electronic design and analyzing the electronic design with the deltas using a Monte Carlo engine.

12. The computer implemented method of claim 1, comprising:
    determining initial parasitic information and initial hierarchical connectivity data from the one or more databases;
    storing the initial parasitic information and initial hierarchical connectivity data in the one or more databases or in the one or more separate data structures; and
    forwarding the one or more databases or one or more corresponding portions thereof as one or more inputs to a plurality of layout simulators that perform one or more layout simulations, analyses, or optimizations.

13. A system for implementing a simulation platform with dynamic device model libraries, comprising:
    non-transitory computer accessible storage medium storing thereupon program code; and
    at least one processor executing the program code to identify one or more design databases stored in a non-transitory computer accessible storage medium and managed by a database management system for an electronic design, to append simulation inputs to the one or more design databases or store the simulation inputs as one or more separate data structures that are co-managed by the database management system that also manages the one or more design databases, and to perform one or more simulations, analyses, or optimizations at a first level with a compiled model interface that allows high-level programming language inputs and functions in tandem with the simulation inputs in the database management system at one or more simulation engines.

14. The system for claim 13, the at least one processor further executing the program code to hierarchical design data from the one or more design databases, to generate initial hierarchical connectivity data for the hierarchical design data, and to append the initial hierarchical connectivity data to the one or more design databases or storing the initial hierarchical connectivity data as one or more first database management system co-managed data structures that are co-managed by the database management system.

15. A simulation platform with dynamic device model libraries, comprising:
    one or more servers hosting thereupon a database management system;
    a simulation frontend including or coupled to one or more electronic design databases managed by the database management system, stored in a persistent storage device, and including design data in one or more domains across one or more design fabrics; and
    a simulation backend including or operatively coupled to at least a compiled model interface that allows high-level programming language inputs and one or more simulators that perform simulations, analyses, or optimizations for an electronic design by receiving simulation inputs appended to the one or more electronic design databases or stored in one or more separate data structures that are co-managed by the database management system.

16. The simulation platform of claim 15, the simulation frontend further comprising:
    hierarchical connectivity data and flat connectivity data appended to at least a first electronic design database of the one or more electronic design databases or stored in the one or more separate data structures that are co-managed by the database management system; and
    a matrix representation for the electronic design appended to the first electronic design database or at least a second electronic design database of the one or more electronic design databases or stored in the one or more separate data structures that are co-managed by the database management system.

17. The simulation platform of claim 16, the simulation frontend further comprising:
    a simulation database generator that generates a matrix representation as an input for the one or more simulators for storage in one or more in-memory instances of at least one electronic design database of the one or more electronic design databases in the simulation backend.

18. The simulation platform of claim 16, the simulation frontend further comprising:
    the simulation database generator that generates an in-memory copy of flat connectivity data as the input for the one or more simulators for storage in the one or more in-memory instances of the one or more electronic design databases in the simulation backend.

19. The simulation platform of claim 16, the simulation frontend further comprising:
    a parsing module that parses the electronic design to generate an initial hierarchical connectivity data and is at least partially stored in memory; and
    an extraction module that extracts initial parasitic information from at least one of the one or more electronic design databases.

20. The simulation platform of claim 19, wherein the simulation platform performs one or more re-simulations without using the parsing module or the extraction module.

* * * * *